United States Patent [19]
Hidaka et al.

[11] Patent Number: 5,982,005
[45] Date of Patent: Nov. 9, 1999

[54] SEMICONDUCTOR DEVICE USING AN SOI SUBSTRATE

[75] Inventors: Hideto Hidaka; Katsuhiro Suma; Takahiro Tsuruda, all of Hyogo, Japan

[73] Assignee: Mitsubishi Denki Kabushiki Kaisha, Tokyo, Japan

[21] Appl. No.: 08/977,030

[22] Filed: Nov. 25, 1997

Related U.S. Application Data

[63] Continuation of application No. 08/596,798, Feb. 5, 1996, abandoned.

[30] Foreign Application Priority Data

Feb. 17, 1995 [JP] Japan ................................. 7-029732

[51] Int. Cl.⁶ ......................... H01L 27/01; H01L 27/12
[52] U.S. Cl. ...................... 257/347; 257/349; 257/529
[58] Field of Search ............................. 257/347, 349, 257/209, 306, 409, 529, 530, 537

[56] References Cited

U.S. PATENT DOCUMENTS

| | | | |
|---|---|---|---|
| 3,792,319 | 2/1974 | Tsang ........................................ | 257/529 |
| 4,413,272 | 11/1983 | Mochizuki et al. ..................... | 257/529 |
| 4,455,567 | 6/1984 | Lee et al. ................................ | 257/488 |
| 4,590,509 | 5/1986 | Esser et al. ............................. | 257/489 |
| 4,599,792 | 7/1986 | Cade et al. . | |
| 4,602,420 | 7/1986 | Saito ........................................ | 257/209 |
| 4,628,590 | 12/1986 | Udo et al. ................................ | 257/529 |
| 4,675,982 | 6/1987 | Noble, Jr. et al. ....................... | 257/508 |
| 4,849,805 | 7/1989 | Herbert et al. .......................... | 257/347 |
| 4,851,894 | 7/1989 | De Ferron et al. . | |
| 4,899,202 | 2/1990 | Blake et al. ............................ | 357/23.7 |
| 4,903,111 | 2/1990 | Takemae et al. ....................... | 257/209 |
| 4,946,799 | 8/1990 | Blake et al. ............................ | 437/41 |
| 4,965,213 | 10/1990 | Blake ..................................... | 437/21 |
| 5,025,300 | 6/1991 | Billig et al. ............................. | 257/529 |
| 5,125,007 | 6/1992 | Yamaguchi et al. .................... | 357/23.7 |
| 5,212,397 | 5/1993 | See et al. ............................... | 257/347 |
| 5,223,735 | 6/1993 | Kinoshita et al. ....................... | 257/529 |
| 5,246,870 | 9/1993 | Merchant ................................ | 257/347 |
| 5,252,844 | 10/1993 | Takagi ..................................... | 257/529 |
| 5,256,899 | 10/1993 | Rangappan ............................ | 257/665 |
| 5,440,161 | 8/1995 | Iwamatsu et al. ...................... | 257/349 |
| 5,635,744 | 6/1997 | Hidaka et al. .......................... | 257/349 |
| 5,798,475 | 8/1998 | Reynes et al. ......................... | 102/202.5 |

*Primary Examiner*—Olik Chaudhuri
*Assistant Examiner*—Phat X. Cao
*Attorney, Agent, or Firm*—McDermott, Will & Emery

[57] ABSTRACT

A semiconductor device includes an SOI substrate, trench memory cells including trench capacitors formed in the SOI substrate and a mesa or trench isolation region for isolating the trench memory cells. As a result, the trench memory cells are isolated more completely and soft errors are reduced.

15 Claims, 28 Drawing Sheets

LOCOS ISOLATION REGION

FIELD SHIELD ISOLATION REGION

FIELD SHIELD ISOLATION REGION

MESA ISOLATION REGION

SEMICONDUCTOR DEVICE USING AN SOI SUBSTRATE

This application is a continuation of application Ser. No. 08/596,798 filed Feb. 5, 1996, now abandoned.

BACKGROUND OF THE INVENTION

1. Field of the Invention

The present invention relates to semiconductor devices, and more particularly to a semiconductor memory device using an SOI (Silicon (Semiconductor) On Insulator) substrate.

2. Description of the Background Art

A semiconductor memory device capable of storing data is provided as one of semiconductor devices. Generally, semiconductor memory devices are roughly classified into volatile memories including a random access memory (RAM) and non-volatile memories including a read only memory (ROM). Volatile memories are further classified into dynamic random access memories (DRAMs) and static random access memories (SRAMs). Non-volatile memories include a mask ROM, an EPROM, a flash memory, an EEPROM and a fuse ROM.

The most common memory cell in a DRAM includes an n channel MOS transistor and a capacitor formed on a p type silicon substrate. The transistor has one source/drain electrode connected to a bit line and the other source/drain electrode connected to a storage node of the capacitor. Therefore, when a word line rises, the transistor turns on, thereby applying a voltage of the bit line to the capacitor. When the word line falls, data is stored in the capacitor.

As described above, a memory cell of a DRAM requires refreshing because data is stored therein by accumulating electrical charges in a capacitor. However, since the structure of a memory cell is simple, a DRAM having a large storage capacity can be manufactured at a low cost.

However, since data is stored in the DRAM memory cell by accumulating charges in the capacitor, α-particles generated in a package, interconnection material, and the like are injected into a silicon substrate, thereby changing the amount of charges stored in the capacitor. More specifically, inversion of the logic of the stored data, the so-called soft error, is apt to occur. Especially in a trench memory cell, the soft error is more apt to occur than a stacked memory cell because its capacitor is formed in the silicon substrate.

In addition, although elements formed on the silicon substrate are electrically isolated by element isolation regions using the LOCOS (Locational Oxidation of Silicon), the field shield method or the like, a complete element isolation has been principally impossible because of the great thickness of the silicon substrate. As a result, there has been a problem that the so-called latch-up tends to occur in which normal operation is hindered by a parasitic MOS transistor attaining an on-state.

Furthermore, since the LOCOS isolation region and the field shield isolation region described above are generally thicker than the element active region, it has been difficult to form various films in these regions.

When a fuse link employed in such as a redundancy circuit of DRAMs is to be blown out with a laser, a considerable thought must be given to the arrangement or the structure of the fuse link so that the silicon substrate under the fuse link is not damaged by emission of the laser. Similarly in bonding wires to bonding pads, thought should also be given to the arrangement or the structure of pads so that the silicon substrate is not damaged by the impact of bonding.

If elements on an SOI substrate are isolated by LOCOS method or the field shield method, the difference in level between the element isolation region and the element active region is great and the subsequent step of stacking layers is difficult. Another problem remains unsolved that a crack tends to be generated in the LOCOS isolation region, the field shield isolation region, the silicon active layer, the buried oxide layer and the like during the dicing step in which the silicon wafer is cut into a plurality of chips.

SUMMARY OF THE INVENTION

Therefore, an object of the present invention is to provide a DRAM which suppresses soft errors substantially completely.

Another object of the present invention is to provide a DRAM having a greater storage capacity.

Still another object of the present invention is to provide a semiconductor device which can be easily manufactured.

A further object of the present invention is to provide a semiconductor device in which elements are isolated more sufficiently.

A further object of the present invention is to provide a semiconductor device in which damage given by emission of a laser for blowing out a fuse link is reduced.

A further object of the present invention is to provide a semiconductor device in which damage by bonding is reduced.

A further object of the present invention is provide a semiconductor device in which damage by dicing is reduced.

In accordance with one aspect of the present invention, a semiconductor device is capable of storing data and includes an SOI substrate, a plurality of elements, and an element isolation region. The SOI substrate includes a semiconductor substrate, a buried insulation layer, and a semiconductor active layer. The buried insulation layer is formed on the semiconductor substrate. The semiconductor active layer is formed on the buried insulation layer. The plurality of elements are formed on the SOI substrate. The element isolation region is formed between any of the plurality of elements by removing at least the semiconductor active layer.

As a result, an active region is formed as a mesa by removing the semiconductor active layer other than the element active region, so that the difference in level between the element isolation region and the active region is small. Consequently, the subsequent step of stacking layers is easily performed. In addition, since an insulation layer is buried under the mesa active region, each element is substantially completely isolated from other elements.

In accordance with another aspect of the present invention, a semiconductor device includes an SOI substrate and a trench memory cell. The SOI substrate includes a semiconductor substrate, a buried insulation layer, a semiconductor active layer and a first trench. The buried insulation layer is formed on the semiconductor substrate. The semiconductor active layer is formed on the buried insulation layer. The first trench is formed to penetrate through the semiconductor active layer and reach at least the buried insulation layer. The trench memory cell has a capacitor formed in the first trench.

Therefore, since the capacitor of the trench memory cell is formed in the trench in the SOI substrate, a part of the capacitor is surrounded by the buried insulation layer, reducing soft errors as compared to a conventional DRAM employing a bulk silicon substrate and having no buried insulation layer.

In accordance with a still another aspect of the present invention, a semiconductor device includes an SOI substrate, a plurality of elements, an element isolation region, and a fuse link. The SOI substrate includes a semiconductor substrate, a buried insulation layer, and a semiconductor active layer. The buried insulation layer is formed on the semiconductor substrate. The semiconductor active layer is formed on the buried insulation layer. The plurality of elements are formed on the SOI substrate. The fuse link is formed on the element isolation region.

Therefore, the element isolation region is formed under the fuse link, under which region the buried insulation layer is formed, so that the semiconductor substrate is not damaged when the fuse is blown out with a laser.

In accordance with a further aspect of the present invention, a semiconductor device includes an SOI substrate and a field shield isolation region. The SOI substrate includes a semiconductor substrate, a buried insulation layer, and a semiconductor active layer. The buried insulation layer is formed on the semiconductor substrate. The semiconductor active layer is formed on the buried insulation layer. The field shield isolation region includes a field shield isolation film and a field shield conductive film. The field shield isolation film is formed on the semiconductor active layer. The field shield conductive film is formed on the field shield insulation film at a prescribed region other than a dicing line along which a cut will be made.

Consequently, the field shield conductive film is not formed around the dicing line, so that no crack is generated in the field shield isolation film by dicing.

In accordance with a further aspect of the present invention, a semiconductor device includes an SOI substrate and an LOCOS isolation region. The SOI substrate includes a semiconductor substrate, a buried insulation layer, and a semiconductor active layer. The buried insulation layer is formed on the semiconductor substrate. The semiconductor active layer is formed on the buried insulation layer. The LOCOS isolation region is formed on the buried insulation layer at a prescribed region other than a dicing line along which a cut will be made.

Therefore, the LOCOS isolation region is not formed around the dicing line, so that no crack is generated in the LOCOS isolation region by dicing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described in detail with reference to the drawings. In the figures, the identical numerals indicate the identical or corresponding portions.

Embodiment 1

Figure 1:
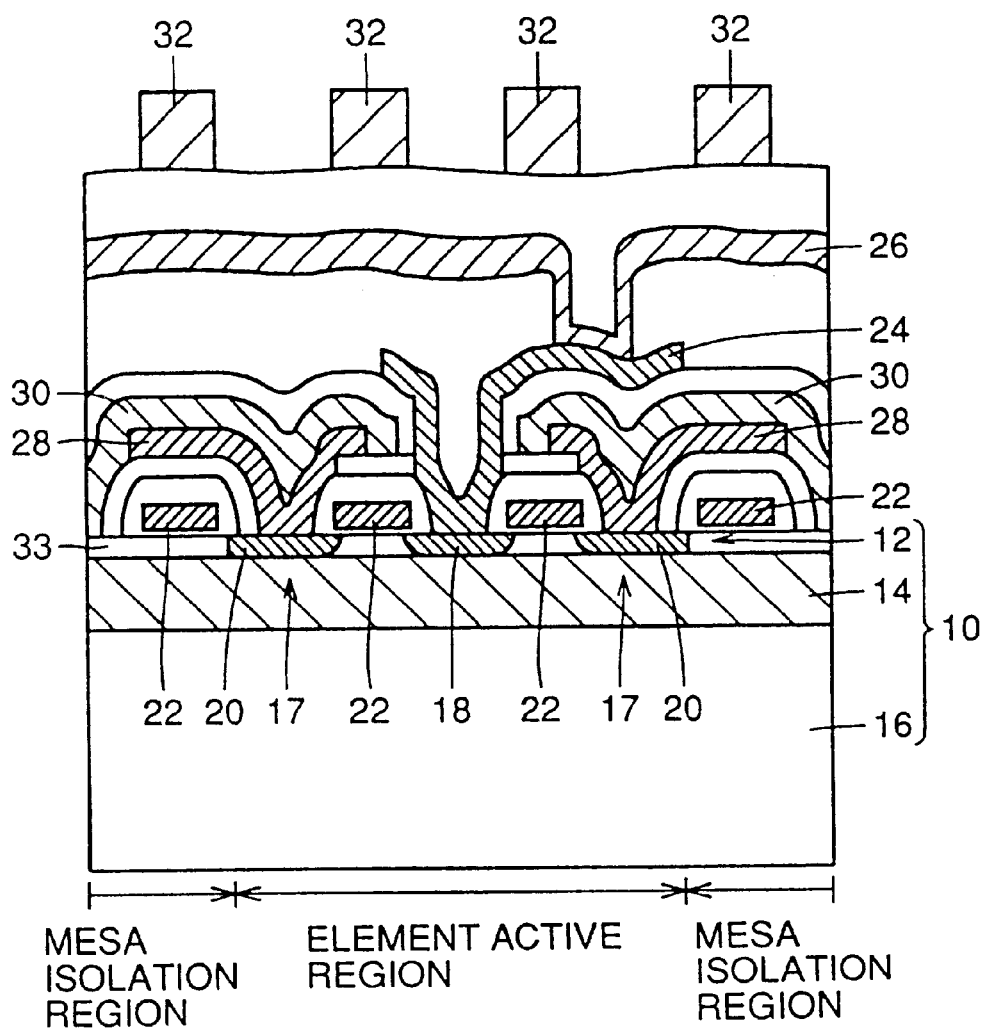
FIGS. 1–9 are cross sectional views showing structures of memory cell portions of DRAMs in accordance with first through ninth embodiments of the present invention.

FIG. 1 is a cross sectional view showing a structure of a memory cell portion of a DRAM in accordance with a first embodiment of the present invention. Referring to FIG. 1, this DRAM utilizes an SOI substrate 10. SOI substrate 10 is formed by burying an oxide layer 14 in a silicon substrate by SIMOX method, for example. SOI substrate 10 includes a p type silicon substrate 16, a buried oxide layer 14 of $SiO_2$ formed thereon, and a thin p type silicon active layer 12 formed thereon. In FIG. 1, two stacked memory cells 17 are formed on SOI substrate 10. Each memory cell 17 includes one n channel MOS transistor and one capacitor. The n channel MOS transistor consists of n type source/drain regions 18 and 20 formed in silicon active layer 12 and a gate electrode serving as a word line 22 formed on silicon active layer 12 with a thin oxide film interposed therebetween. On source/drain region 20 a storage node 28 is formed, on which a cell plate 30 is formed with a thin dielectric layer interposed therebetween. The above-described capacitor is formed by storage node 28, cell plate 30 and the dielectric layer therebetween. Two memory cells 17 share source/drain region 18. On source/drain region 18 an intermediate layer 24 is formed, on which a bit line 26 is formed. One aluminum interconnection 32 is formed corresponding to each word line 22 in order to substantially reduce the resistance of word line 22. Respective word lines 22 are connected via contact holes (not shown) with the corresponding aluminum interconnections 32 with a prescribed distance therebetween.

An element active region for the two n channel MOS transistors is electrically isolated from adjacent other element active regions (not shown) by mesa isolation. More specifically, a portion of silicon active layer 12 other than the element active region is removed by etching, thereby forming the element active region as a mesa. An interlayer insulation film 33 is formed by, for example, CVD method at the etched portion of the active layer, so that the element active region shown in the figure is completely isolated from the adjacent other element active regions.

If an LOCOS isolation region of a silicon oxide film is formed by thermally oxidizing silicon active layer 12, a hump phenomenon may possibly occur in the drain current-gate voltage (Id-Vg) characteristics. This is because a parasitic MOS transistor having a low threshold voltage is generated near the edge of the channel region of the transistor along the direction of the channel. It is considered that the parasitic MOS transistor is formed by taking boron doped in silicon active layer 12 into the oxide film for LOCOS isolation film. It is also considered the parasitic MOS transistor is formed also by the residual stress in the channel region due to bird's beak which is characteristic of LOCOS isolation.

If LOCOS isolation is employed, a big difference in level is generated between the LOCOS isolation region and the element active region, making it difficult to form the upper layers such as storage node 28, cell plate 30, and bit line 26. When the field shield isolation is employed as well, a big difference in level is generated between the field shield isolation region and the element active region. When the field shield isolation is adopted, an oxide film must be formed on silicon active layer 12 and a field shield gate must be formed on the oxide film, leading to an increase in the number of manufacturing steps.

However, in accordance with the first embodiment, the portion other than the element active region is etched and interlayer insulation film 33 such as an oxide film and a nitride film is filled therein, suppressing generation of residual stress in silicon active layer 12. In addition, since silicon active layer 12 is not thermally oxidized, concentration of boron in silicon active layer 12 does not decrease. As a result, a parasitic MOS transistor will not be generated and leakage current in the transistor can be reduced.

Furthermore, substantially no difference in level is generated between the mesa isolation region and the element active region, facilitating the steps of forming storage node 28, cell plate 30, bit line 26 and the like. The number of manufacturing steps is decreased as compared to the case where the field shield isolation is adopted.

Since the capacitor of memory cell 17 is completely isolated from semiconductor substrate 16 by buried insulation layer 14, substantially no soft error occurs. In addition, buried oxide layer 14 is formed under silicon active layer 12, so that each element active region is substantially completely isolated from other element active regions. Consequently, generation of latch up is suppressed, allowing integration of memory cell 17 with a higher density. Therefore, a DRAM having a large storage capacity can be easily achieved.

Embodiment 2

Figure 2:
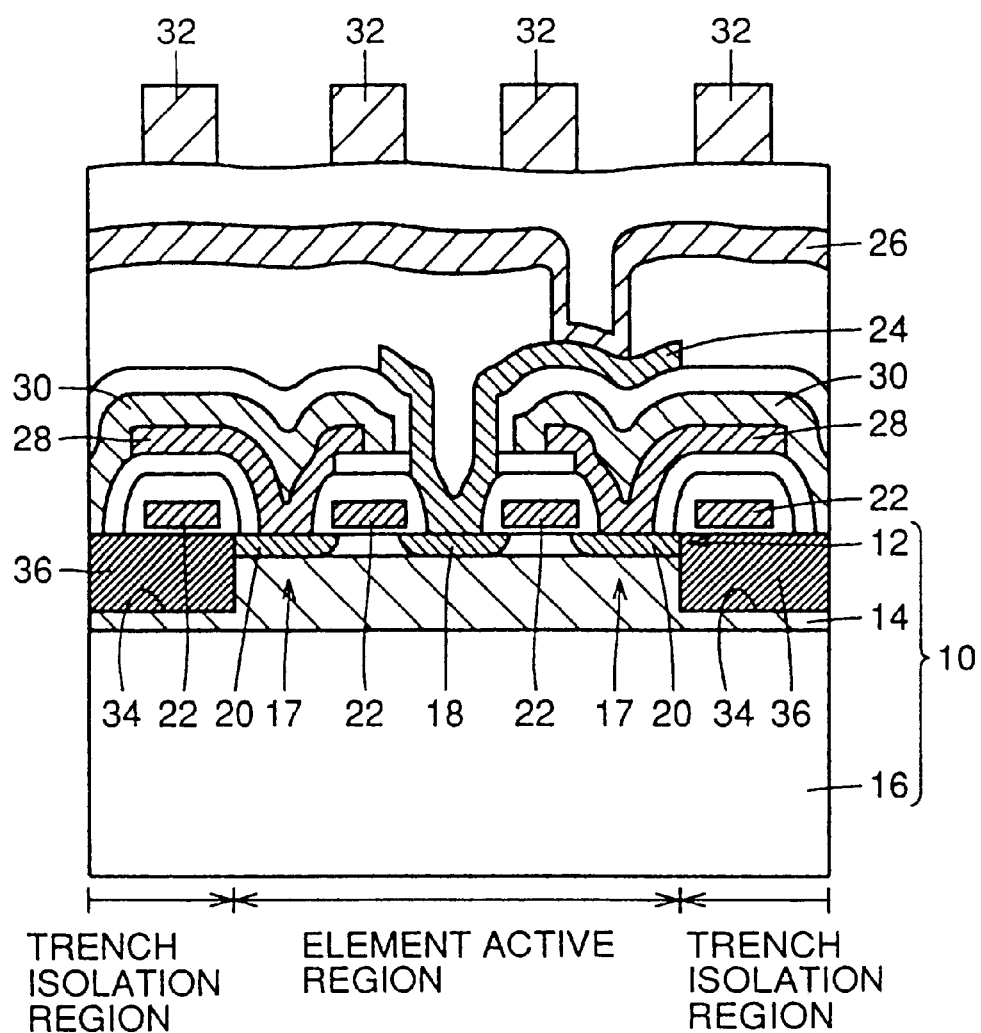

FIG. 2 is a cross sectional view showing a structure of a memory cell portion of a DRAM in accordance with a second embodiment of the present invention. Referring to FIG. 2, not only silicon active layer 12 other than the element active region but also buried oxide layer 14 thereunder is etched in the second embodiment, thereby forming a trench 34 for element isolation. In trench 34 for element isolation, an interlayer insulation film 36 such as an oxide film and a nitride film is filled. The rest of the structure is similar to that of the first embodiment shown in FIG. 1.

In accordance with the second embodiment, the element active regions are electrically isolated from such a trench isolation region, making it possible to obtain more perfect isolation between each element active region and adjacent other element active regions as well as the effects of the first embodiment described above.

Embodiment 3

Figure 3:
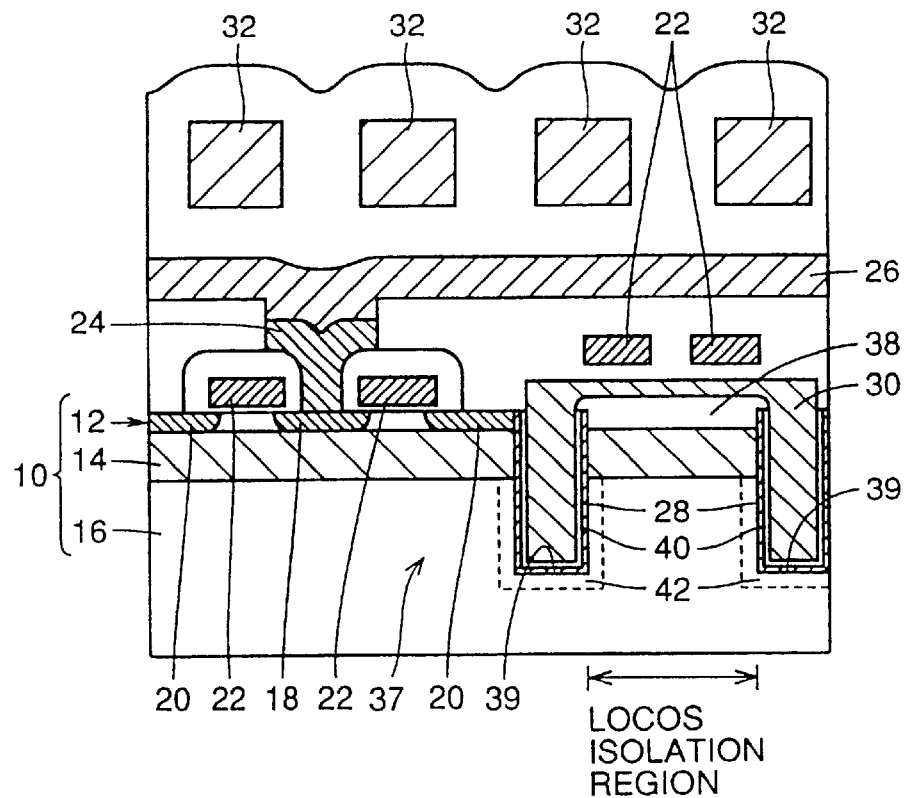

FIG. 3 is a cross sectional view showing a memory portion of a DRAM in accordance with a third embodiment of the present invention. Referring to FIG. 3, a trench memory cell 37 is formed on SOI substrate 10 in this third embodiment.

An oxide film 38 for LOCOS isolation is formed at the region of SOI substrate 10 other than the element active region. In SOI substrate 10, a trench 39 is formed penetrating through silicon active layer 12 and buried oxide layer 14 and reaching p type silicon substrate 16. An $n^+$ type diffusion layer 42 is formed around trench 39. Storage node 28 of, for example, polysilicon is formed on trench 39. Storage node 28 is in contact with source/drain region 20. On storage node 28 a dielectric film 40 is formed, on which a cell plate 30 of, for example, polysilicon is formed. Storage node 28, dielectric film 40 and cell plate 30 form a capacitor of trench type memory cell 37. Since a negative voltage is applied to silicon substrate 16, the pn junction between p type silicon substrate 16 and $n^+$ type diffusion layer 42 is in a reverse bias state. As a result, storage node 28 is electrically isolated from silicon substrate 16.

In accordance with this third embodiment, the trench capacitor is formed in SOI substrate 10, thereby reducing soft errors. In other words, when a trench capacitor is formed in a bulk silicon substrate, the capacitor is surrounded entirely by the silicon substrate; while the upper portion of the capacitor of the third embodiment is surrounded by buried oxide layer 14, leading to a reduction in soft error as compared with the trench memory cell formed in a bulk silicon substrate.

Embodiment 4

Figure 4:
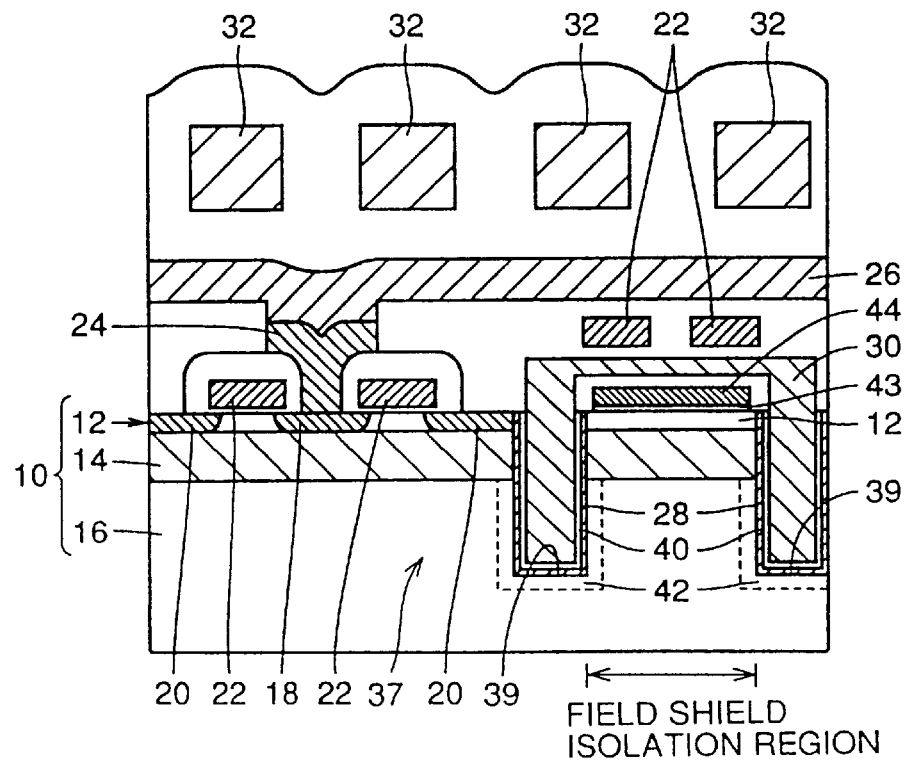

FIG. 4 is a cross sectional view showing a structure of a memory portion of a DRAM in accordance with a fourth embodiment of the present invention. Referring to FIG. 4, a field shield isolation region is formed in place of the LOCOS isolation region in the third embodiment of FIG. 3. More specifically, a thin oxide film 43 is formed on silicon active layer 12 between trench capacitors, and a field shield gate 44 is formed thereon. When a ground voltage is applied to field shield gate 44, silicon active layer 12 thereunder attains an off-state. As a result, the regions on both sides of this silicon active layer 12 are electrically isolated from each other.

Similar effects to the third embodiment described above can be obtained also by isolating the element active regions with the field shield method as in this fourth embodiment.

Embodiment 5

Figure 5:
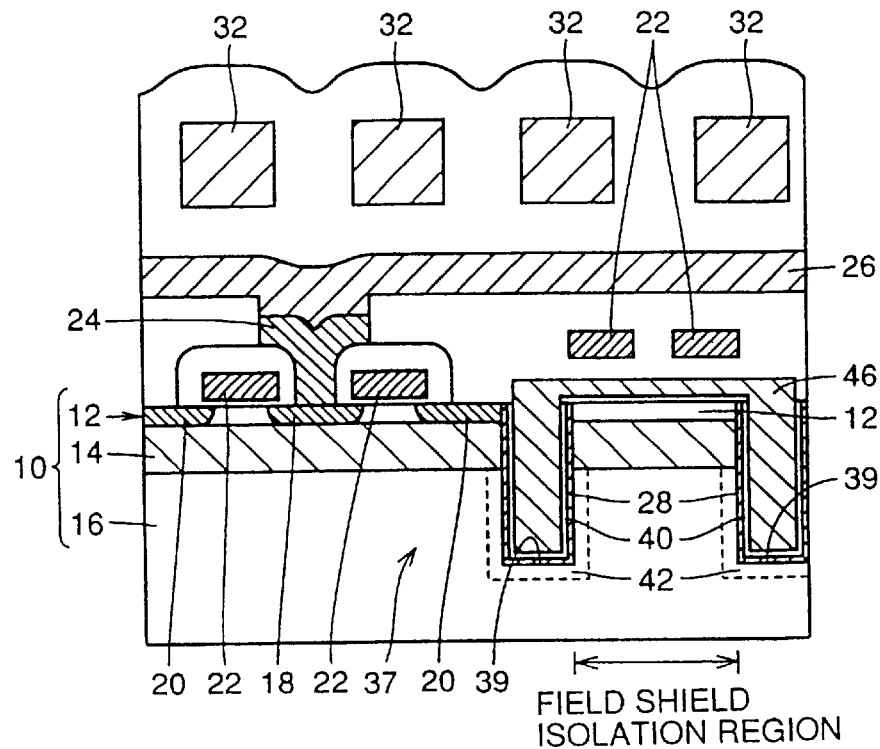

FIG. 5 is a cross sectional view showing a structure of a memory cell portion of a DRAM in accordance with a fifth embodiment of the present invention. Referring to FIG. 5, a common electrode 46 is formed in the fifth embodiment which serves both as cell plate 30 and field shield gate 44 shown in FIG. 4. A ground voltage is applied to common electrode 46, so that silicon active layer 12 located under common electrode 46 attains an off-state. Thus, the cell plate and the field shield gate can be united if the cell plate voltage is a ground voltage.

In accordance with the fifth embodiment, since the cell plate and the field shield gate are united, the step of forming field shield gate 44 shown in FIG. 4 is not required. Therefore, the DRAM of the fifth embodiment can be manufactured more easily than that shown in FIG. 4.

Embodiment 6

Figure 6:
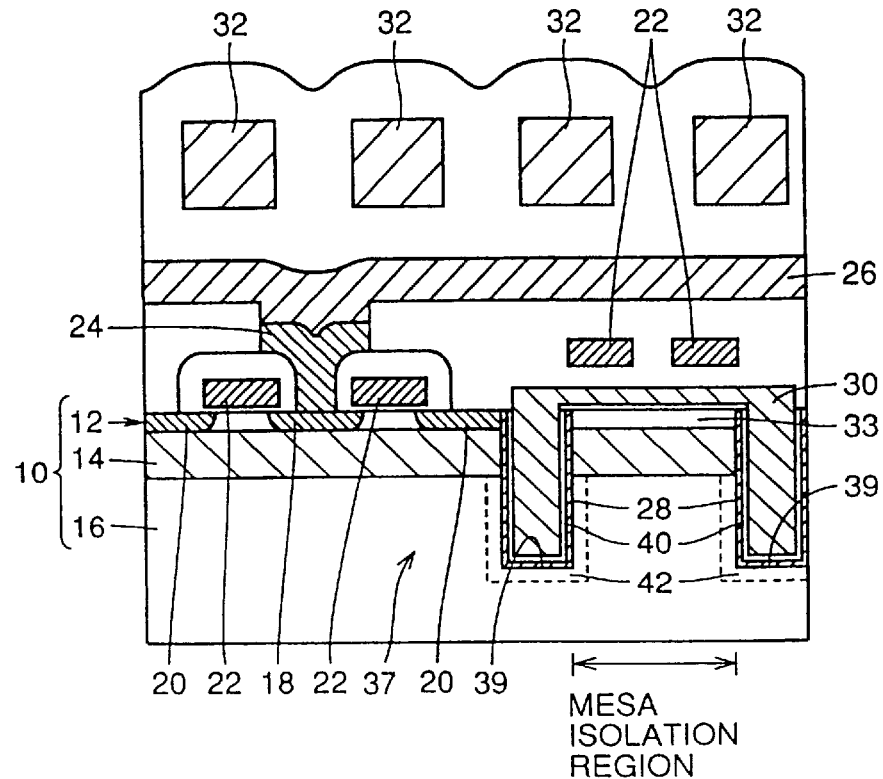

FIG. 6 is a cross sectional view showing a structure of a memory cell portion of a DRAM in accordance with a sixth embodiment of the present invention. Referring to FIG. 6, mesa isolation is adopted in the sixth embodiment rather than LOCOS isolation shown in FIG. 3. More specifically, the portion of silicon active layer 12 other than the element active region is etched away and interlayer insulation film 33 is formed in the etched portion.

In accordance with the sixth embodiment, since mesa isolation is adopted rather than LOCOS isolation, residual stress due to the bird's beak will not be generated in silicon active layer 12, thereby reducing a leakage current caused by the parasitic MOS transistor. As compared to the example shown in FIG. 3 employing LOCOS isolation, substantially no difference in level is generated between the mesa isolation region and the element active region, thereby a facilitating the steps of forming word line 22, bit line 26, and the like.

Embodiment 7

Figure 7:
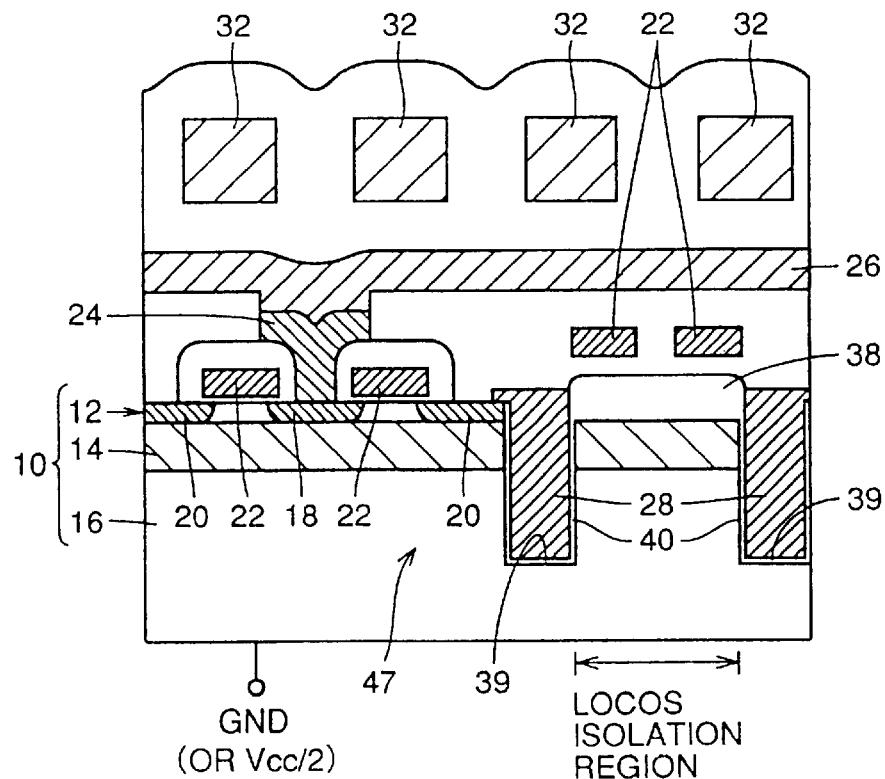

FIG. 7 is a cross sectional view showing a structure of a memory cell portion of a DRAM in accordance with a seventh embodiment of the present invention. Referring to FIG. 7, a reverse trench memory cell 47 is formed in the seventh embodiment in contrast to the embodiment shown in FIG. 3. More specifically, a trench 39 penetrating through silicon active layer 12 and buried oxide layer 14 and reaching silicon substrate 16 is formed in SOI substrate 10, and dielectric film 40 and storage node 28 are formed thereon in this order. A ground voltage GND is applied to silicon substrate 16. Therefore, silicon substrate 16 functions as a cell plate in this seventh embodiment.

Figure 43:
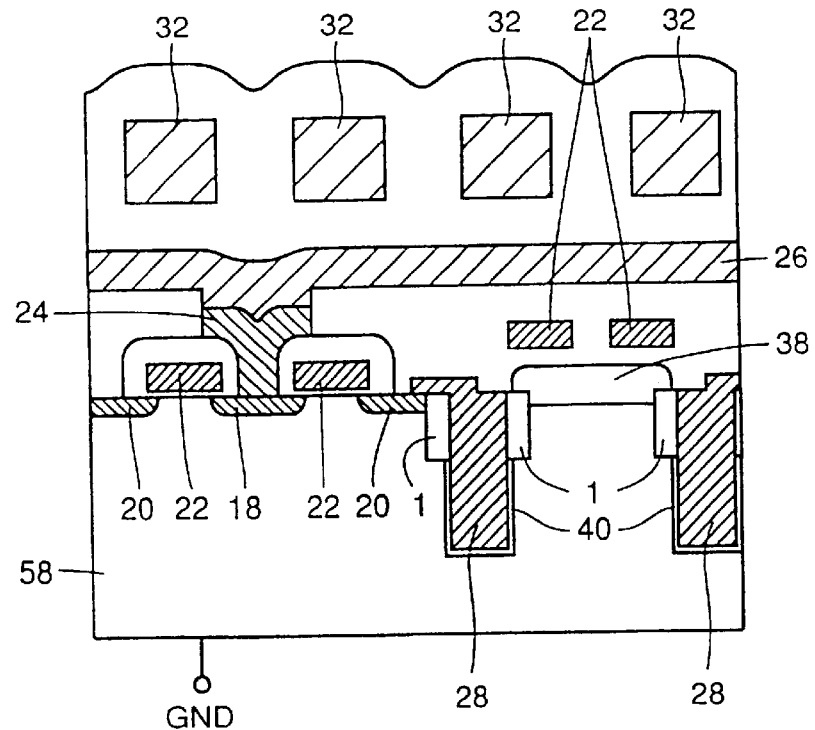
FIG. 43 is a cross sectional view showing an example of a conventional DRAM including a trench memory cell formed in a bulk silicon substrate.

FIG. 43 is a cross sectional view showing a structure of a reverse trench memory cell formed in a p type bulk silicon substrate 58. Ground voltage GND is applied to bulk silicon substrate 58, so that silicon substrate 58 functions as a cell plate. Oxide layer 1 is formed to surround an upper portion of the trench capacitor. Oxide layer 1 is provided to reduce a leakage current flowing from source/drain region 20 to a proximal region of the trench capacitor. Since ground voltage GND applied to silicon substrate 58 functions not only as a cell plate voltage but also as a substrate voltage, an intermediate voltage Vcc/2, for example, cannot be applied instead of ground voltage GND.

Figure 44:
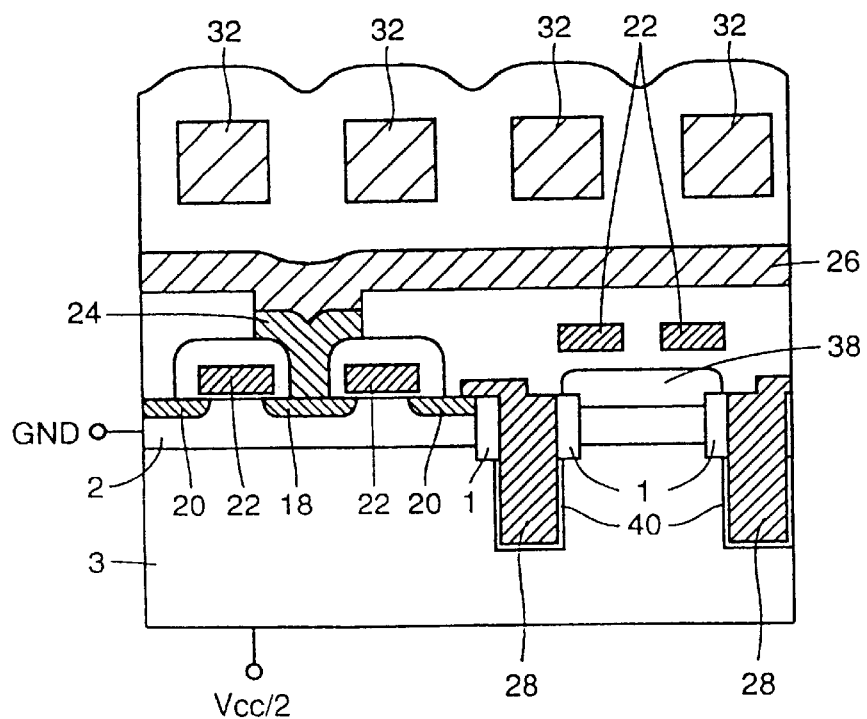
FIG. 44 is a cross sectional view showing another example of a conventional DRAM including a trench memory cell formed in a bulk silicon substrate.

Thus, a well 2 must be formed as shown in FIG. 44 in order to apply the cell plate voltage separately from the substrate voltage. Referring to FIG. 44, p type well 2 is formed at n type bulk silicon substrate 3. Here, in addition to ground voltage GND applied to well 2 as a substrate voltage, intermediate voltage Vcc/2 is applied to silicon substrate 3 as a cell plate voltage.

In accordance with the seventh embodiment, cell plate 30 shown in FIG. 3 need not be formed because silicon substrate 16 is utilized as a cell plate. Furthermore, oxide layer 1 for preventing a leakage current need not be formed as shown in FIG. 43 because silicon active layer 12 is isolated from silicon substrate 16 by buried oxide layer 14. A separate voltage can be applied to silicon substrate 16 as a cell plate voltage without forming well 2 shown in FIG. 44. Therefore, intermediate voltage Vcc/2 can be applied to silicon substrate 16 instead of ground voltage GND.

Embodiment 8

Figure 8:
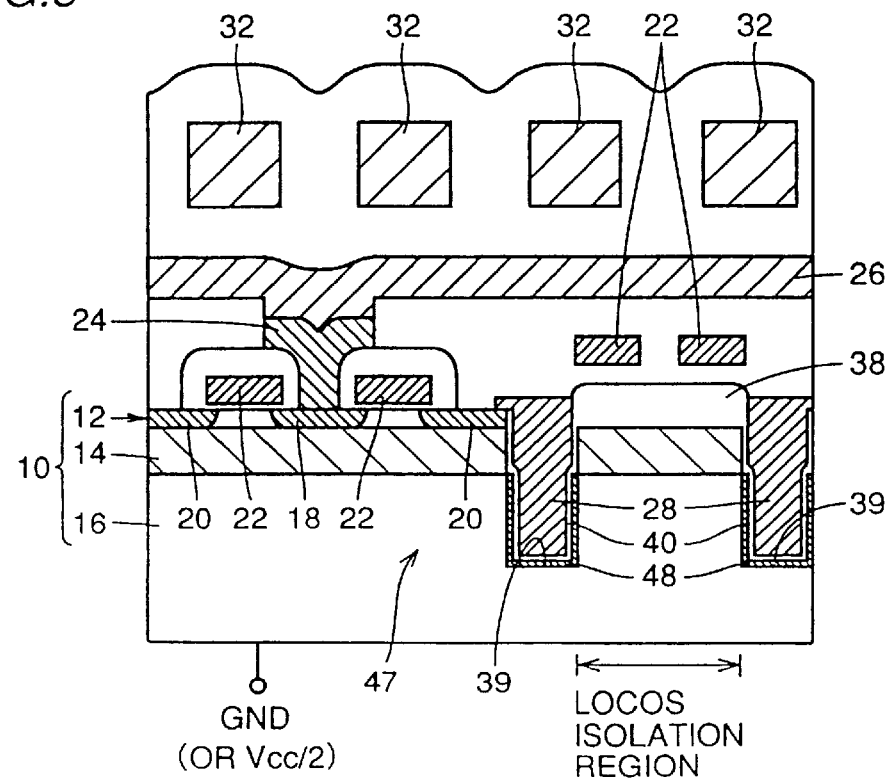

FIG. 8 is a cross sectional view showing a structure of a memory cell portion of a DRAM in accordance with an eighth embodiment of the present invention. Referring to FIG. 8, an intermediate electrode 48 of polysilicon is formed between silicon substrate 16 and dielectric film 40 in addition to the structure of FIG. 7, according to the eighth embodiment. Consequently, dielectric film 40 is positioned between polysilicon and polysilicon, thereby improving reliability of the trench capacitor over that shown in FIG. 7.

Embodiment 9

Figure 9:
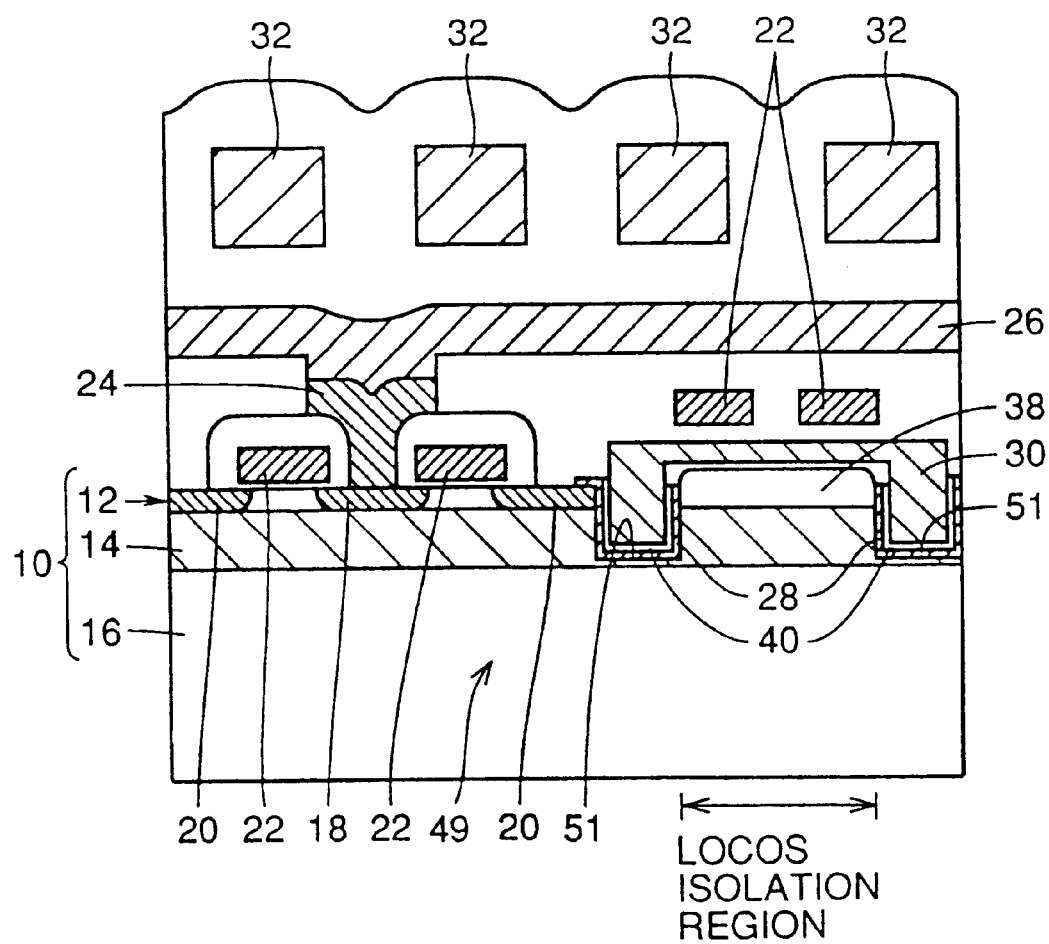

FIG. 9 is a cross sectional view showing a structure of a memory portion of a DRAM in accordance with a ninth embodiment of the present invention. Referring to FIG. 9, a shallow trench memory cell 49 is formed in the ninth embodiment in contrast to the embodiment shown in FIG. 3. More specifically, a trench 51 for the capacitor of memory cell 49 penetrates only silicon active layer 12 and reaches buried oxide layer 14. As a result, the bottom of trench 51 is so shallow as to be positioned in buried oxide layer 14.

In accordance with the ninth embodiment, a capacitor is completely surrounded by buried oxide layer 14, so that substantially no soft-errors are generated. Since trench 51 for this capacitor does not reach silicon substrate 16, diffusion layer 42 for electrically isolating the capacitor from silicon substrate 16 as shown in FIG. 3 need not be formed.

Embodiment 10

Figure 10:
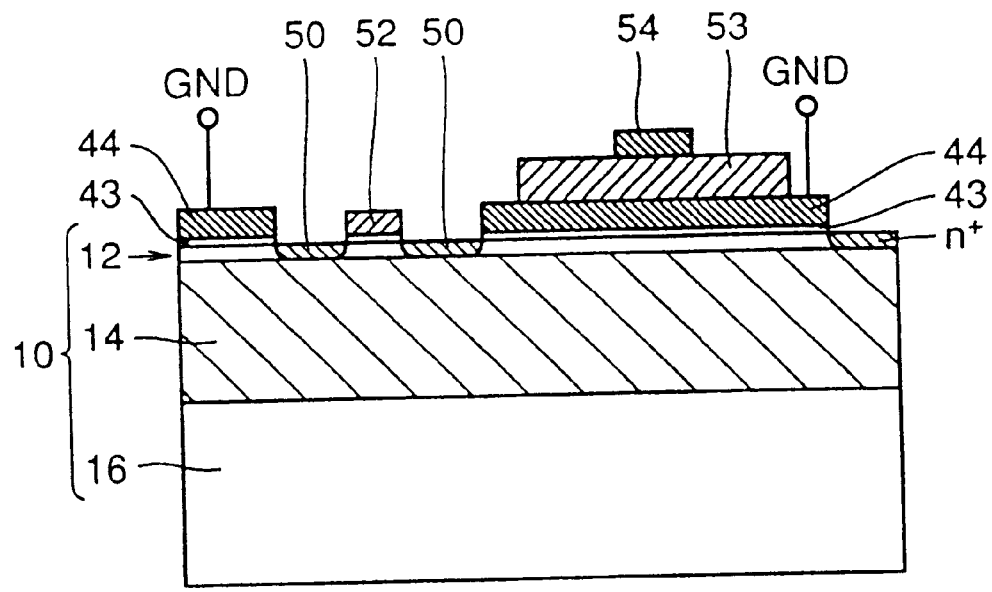
FIGS. 10–22 are cross sectional views showing structures of fuse link portions of semiconductor devices in accordance with tenth through twenty-second embodiments of the present invention.

FIG. 10 is a cross sectional view showing a part of the structure of a semiconductor device in accordance with a tenth embodiment of the present invention. Referring to FIG. 10, an $n^+$ type source/drain region 50 is formed in silicon active layer 12 of SOI substrate 10. At a portion located between source/drain regions 50 and on silicon active layer 12, a gate electrode 52 is formed with a thin oxide film interposed therebetween. Source/drain regions 50 and gate electrode 52 form an n channel MOS transistor.

In addition, a field shield isolation region is formed on SOI substrate 10. More specifically, a thin oxide film is formed on the portion of silicon active layer 12 other than the element active region, and field shield gate 44 is formed thereon. Ground voltage GND is applied to field shield gate 44, whereby silicon active layer 12 positioned under field shield gate 44 attains an off-state.

On field shield gate 44 an oxide film 53 is formed, on which a fuse link 54 is formed. In a DRAM, for example, whether fuse link 54 is blown out or not is determined by whether or not-to activate the redundancy circuit. Fuse link 54 is blown out by laser emission, thereby an address indicating a defective portion of a memory cell array is programmed. Fuse link 54 is formed in the same layer as the bit line and the like.

In accordance with the tenth embodiment, buried oxide layer 14 is formed under fuse link 54, so that silicon substrate 16 will not be damaged by emission of a layer when laser beams are emitted to blow out fuse link 54. In addition, field shield gate 44, as well as buried oxide layer 14, is formed under fuse link 54 in this tenth embodiment, thereby further reducing damage to silicon substrate 16 caused by emission of the laser.

If a bulk silicon substrate is employed in place of SOI substrate 10, field shield gate 44 damaged by emission of the laser may possibly make a short circuit with the bulk silicon substrate. In the tenth embodiment, however, the damaged field shield gate 44 will not make such a short circuit with silicon substrate 16 because buried oxide layer 14 is formed.

Embodiment 11

Figure 11:
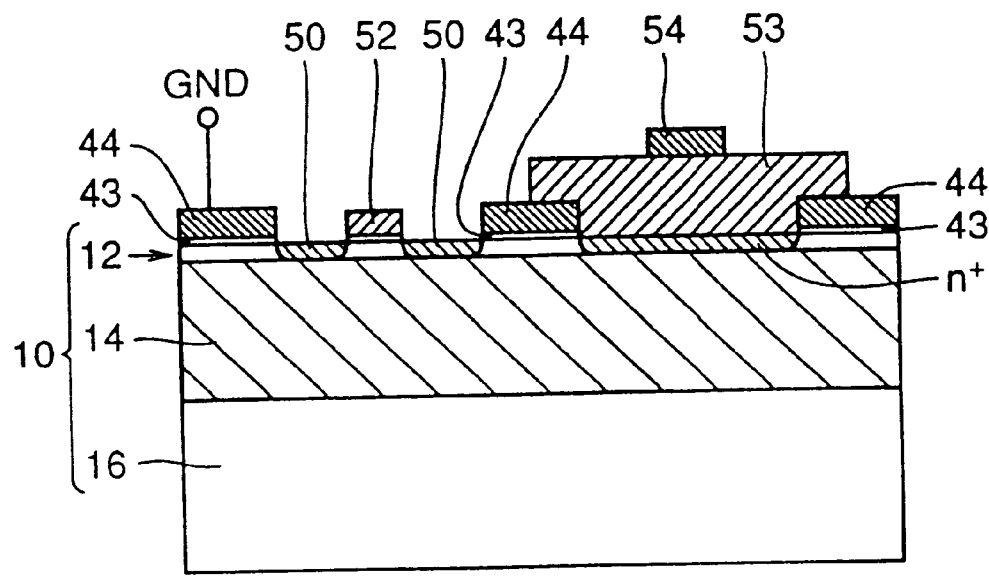

FIG. 11 is a cross sectional view showing a part of the structure of a semiconductor device in accordance with an eleventh embodiment of the present invention. Referring to FIG. 11, field shield gate 44 positioned under fuse link 54 is removed by, for example, etching in the eleventh embodiment, in contrast to FIG. 10.

According to the eleventh embodiment, field shield gate 44 is not formed under fuse link 54, whereby laser beams emitted to blow out fuse link 54 may damage SOI substrate 10. However, buried oxide layer 14 is formed in SOI substrate 10 unlike the bulk silicon substrate, so that silicon substrate 16 will be given substantially no damage by laser emission. Furthermore, since field shield gate 44 is not formed under fuse link 54, field shield gate 44 will not be damaged by emission of the laser.

Embodiment 12

Figure 12:
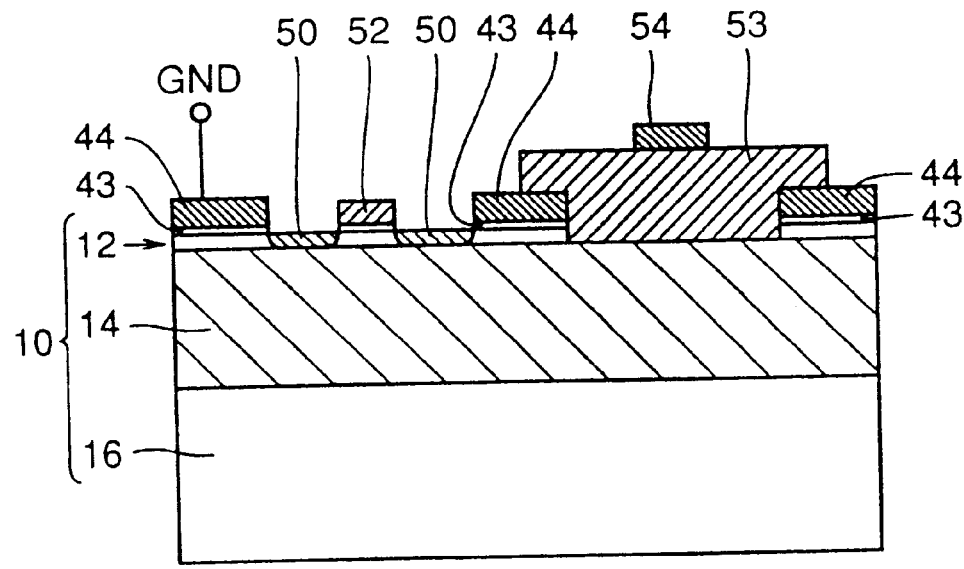

FIG. 12 is a cross sectional view showing a part of the structure of a semiconductor device in accordance with a twelfth embodiment of the present invention. Referring to FIG. 12, in addition to field shield gate 44, silicon active layer 12 located thereunder is removed by, for example, etching in the twelfth embodiment in contrast to the embodiment shown in FIG. 11.

According to the twelfth embodiment, the effects similar to those in the eleventh embodiment described above can be obtained and silicon active layer 12 will not be damaged by laser beam emission because silicon active layer 12 is not formed under fuse link 54.

Embodiment 13

Figure 13:
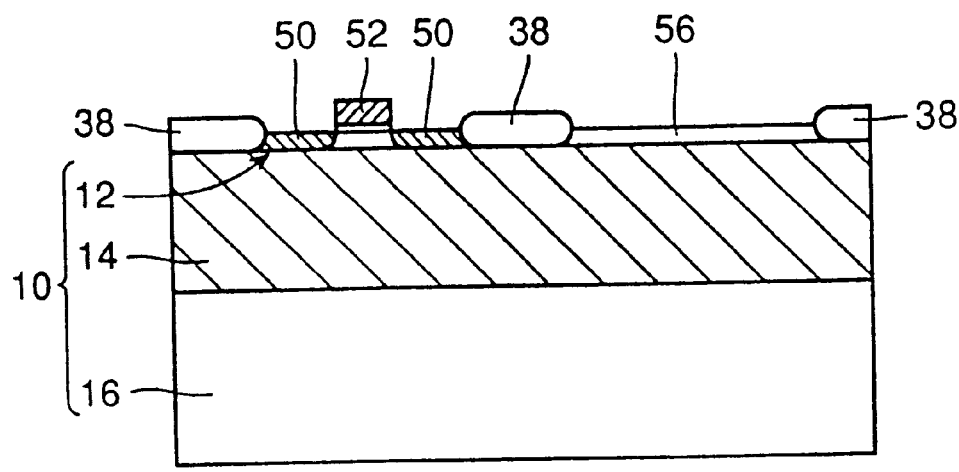

FIG. 13 is a cross sectional view showing a part of the structure of a semiconductor device in accordance with a thirteenth embodiment of the present invention. Referring to FIG. 13, an oxide film 38 for LOCOS isolation is formed on SOI substrate 10 in the thirteenth embodiment. A fuse link 56 constituted by the silicon active layer is formed on buried oxide layer 14 in SOI substrate 10.

According to the thirteenth embodiment, since fuse link 56 is formed to utilize silicon active layer 12, a conductive layer for forming fuse link 54 need not be formed additionally. Furthermore, since buried oxide layer 14 is formed under fuse link 56, silicon substrate 16 positioned under fuse link 56 will not be damaged when laser beams are emitted to blow out fuse link 56.

Embodiment 14

Figure 14:
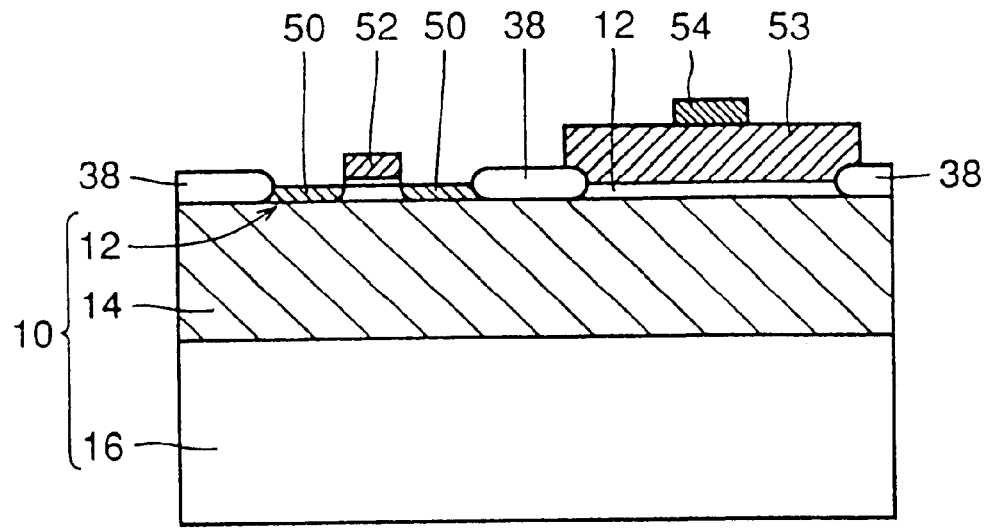

FIG. 14 is a cross sectional view showing a part of the structure of a semiconductor device in accordance with a fourteenth embodiment of the present invention. Referring to FIG. 14, LOCOS isolation is employed in this embodiment instead of the field shield isolation shown in FIG. 11. More specifically, oxide film 38 for LOCOS isolation is formed on buried oxide layer 14 excluding the element active region of the silicon active layer.

According to the fourteenth embodiment, the effects similar to those in the eleventh embodiment can be obtained even if LOCOS isolation is employed instead of field shield isolation.

Embodiment 15

Figure 15:
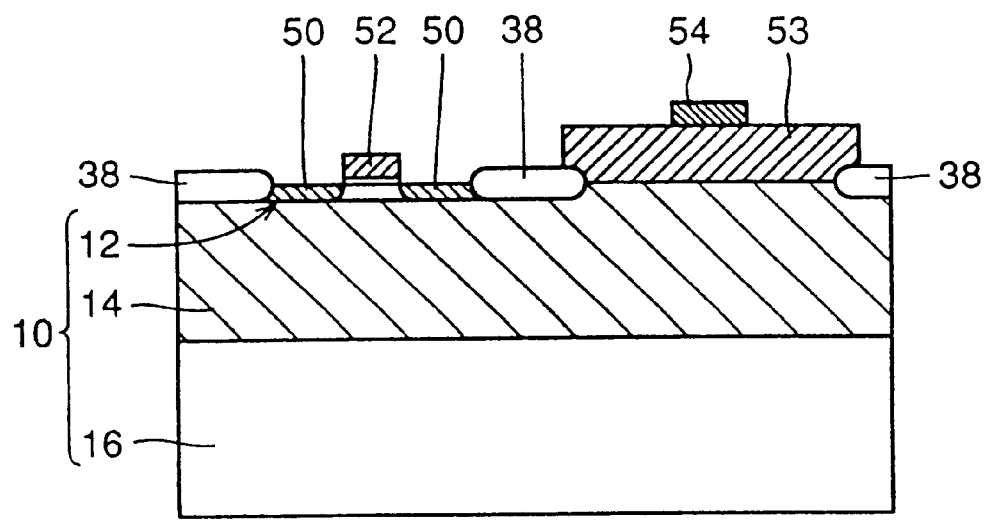

FIG. 15 is a cross sectional view showing a part of the structure of a semiconductor device in accordance with a fifteenth embodiment of the present invention. Referring to FIG. 15, silicon active layer 12 located under fuse link 54 is also removed by, for example, etching in the fifteenth embodiment in contrast to the embodiment shown in FIG. 14. Therefore, silicon active layer 12 will not be damaged by laser beam emission for blowing out fuse link 54. As a result, the effects similar to those in the twelfth embodiment shown in FIG. 12 can be obtained in this embodiment, though LOCOS isolation is employed instead of field shield isolation of FIG. 12.

Embodiment 16

Figure 16:
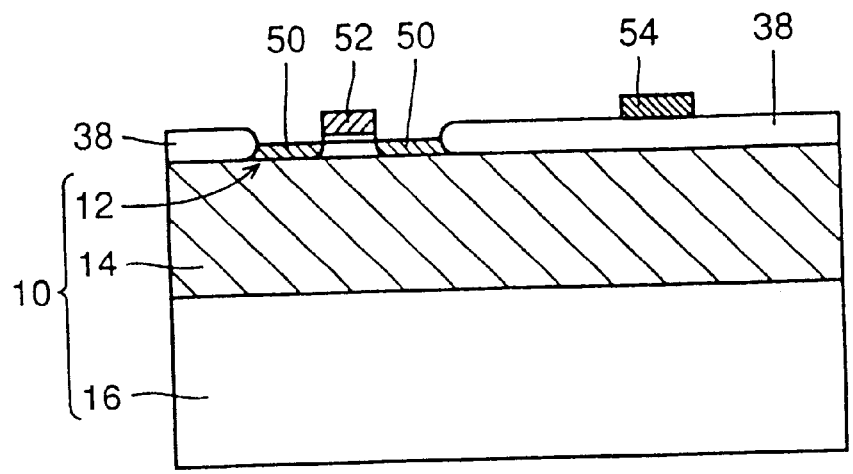

FIG. 16 is a cross sectional view showing a part of the structure of a semiconductor device in accordance with a sixteenth embodiment of the present invention. Referring to FIG. 16, fuse link 54 is formed on oxide film 38 for LOCOS isolation in the sixteenth embodiment, different from the embodiments shown in FIGS. 14 and 15. This fuse link 54 is formed in the same layer as the field shield gate and the like.

According to the sixteenth embodiment, oxide film 38 for LOCOS isolation is formed under fuse link 54 as well as buried oxide layer 14, so that silicon substrate 16 will not be damaged by laser beam emission for blowing out fuse link 54.

Embodiment 17

Figure 17:
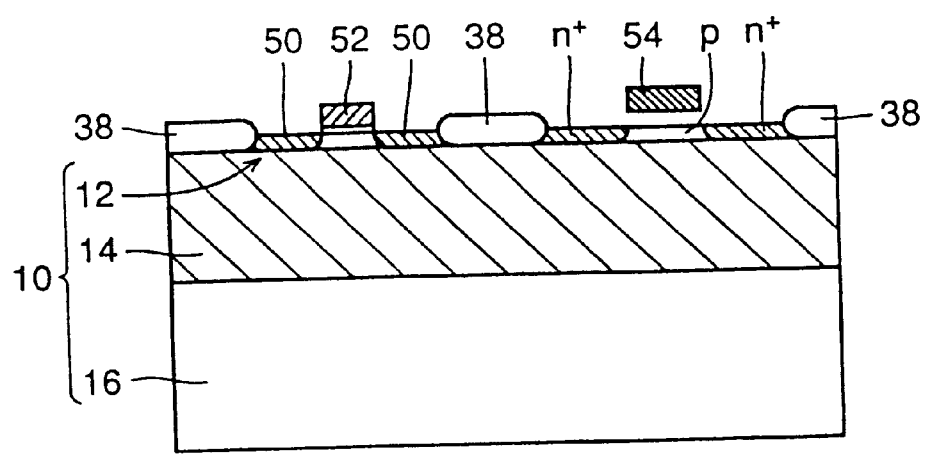

FIG. 17 is a cross sectional view showing a part of the structure of a semiconductor device in accordance with a seventeenth embodiment of the present invention. Referring to FIG. 17, oxide film 38 for LOCOS isolation is not formed under fuse link 54 in contrast to the embodiment shown in FIG. 16. This fuse link 54 is formed in the same layer as the field shield gate.

According to the seventeenth embodiment, since oxide film 38 for LOCOS isolation is not formed under fuse link 54, oxide layer 38 for LOCOS isolation will not be damaged by laser beam emission for blowing out fuse link 54. In addition, silicon substrate 16 will be given substantially no damage by laser beam emission because buried oxide layer 14 is formed, though oxide film 38 for LOCOS isolation is not formed under fuse link 54.

Embodiment 18

Figure 18:
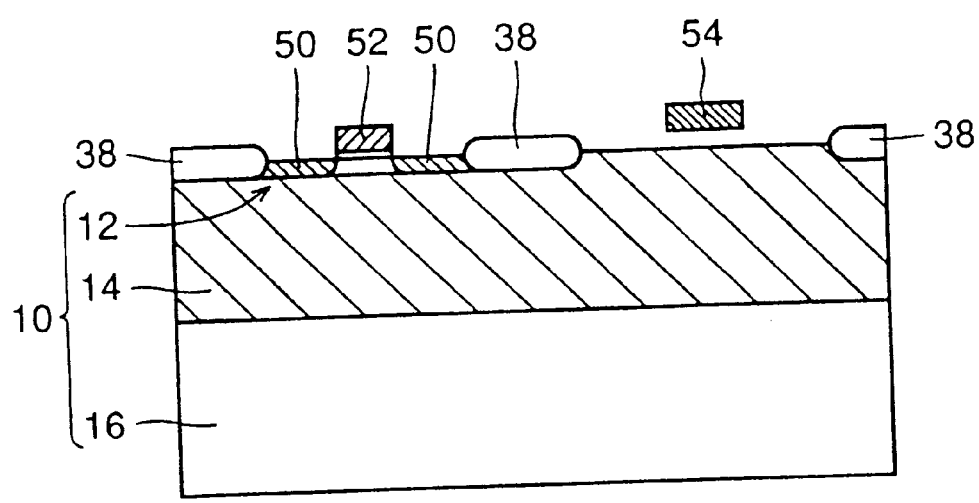

FIG. 18 is a cross sectional view showing a part of the structure of a semiconductor device in accordance with an eighteenth embodiment of the present invention. Referring to FIG. 18, silicon active layer 12 positioned under fuse link 54 is also removed in the eighteenth embodiment in contrast to the embodiment shown in FIG. 17.

According to the eighteenth embodiment, silicon active layer 12 will not be damaged by laser beam emission and similar effects to those in the seventeenth embodiment shown in FIG. 17 can be obtained.

Embodiment 19

Figure 19:
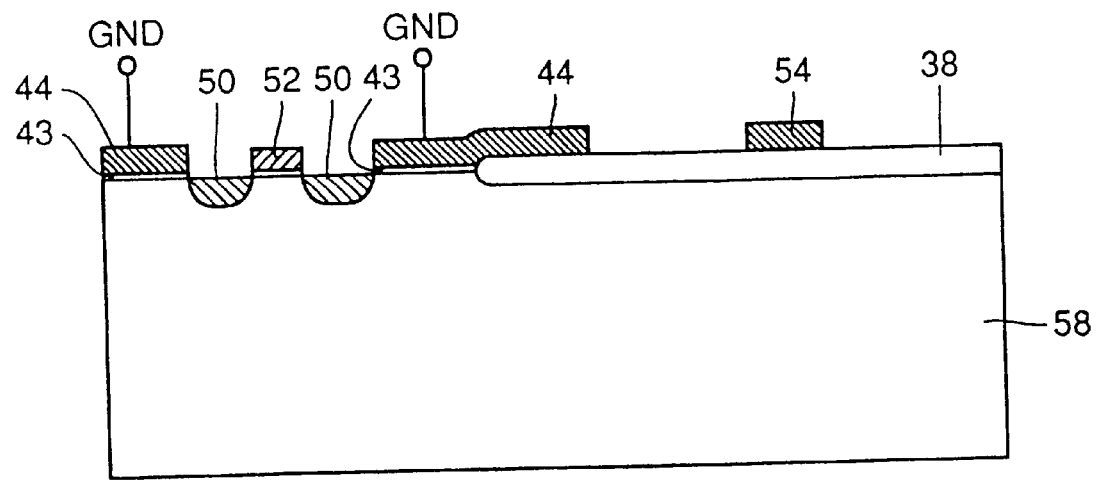

FIG. 19 is a cross sectional view showing a part of the structure of a semiconductor device in accordance with a nineteenth embodiment of the present invention. Referring to FIG. 19, bulk silicon substrate 58 replaces the SOI substrate shown in FIG. 16 in the nineteenth embodiment. Field shield isolation is employed as element isolation, together with LOCOS isolation. Here, fuse link 54 is formed on oxide film 38 for LOCOS isolation in the same layer as field shield gate 44.

According to the nineteenth embodiment, since fuse link 54 is formed in the layer same as field shield gate 44, a conductive layer need not be formed in order to form fuse link 54. Furthermore, since oxide film 38 for LOCOS isolation is formed under fuse link 54, silicon substrate 58 will not be damaged by laser beam emission for blowing out fuse link 54.

Embodiment 20

Figure 20:
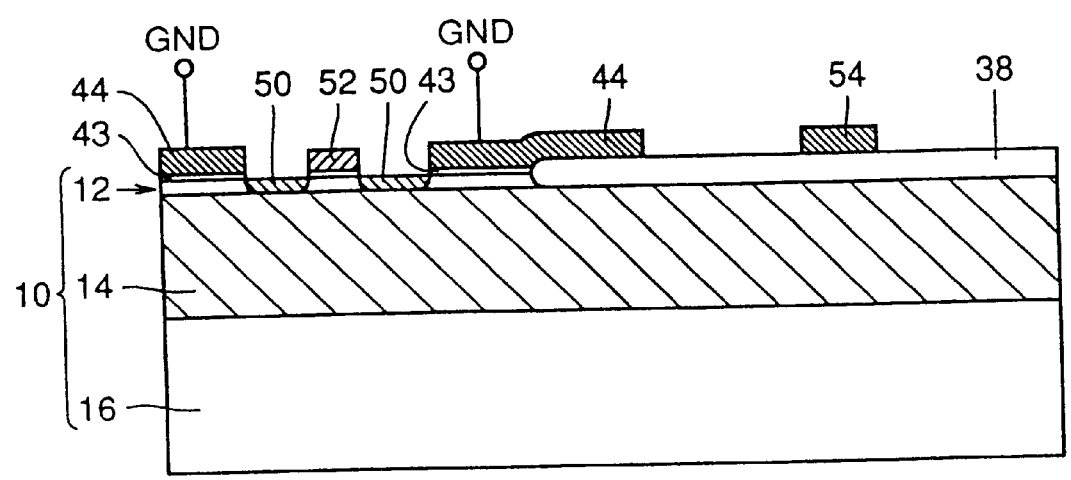

FIG. 20 is a cross sectional view showing a part of the structure of a semiconductor device in accordance with a twentieth embodiment of the present invention. Referring to FIG. 20, SOI substrate 10 is employed in the twentieth embodiment in place of bulk silicon substrate 58 shown in FIG. 19. Consequently, the effects similar to those in the nineteenth embodiment shown in FIG. 19 can be obtained and damage given by laser beam emission to silicon substrate 16 can further be reduced as a result of formation of buried oxide layer 14 under fuse link 54.

Embodiment 21

Figure 21:
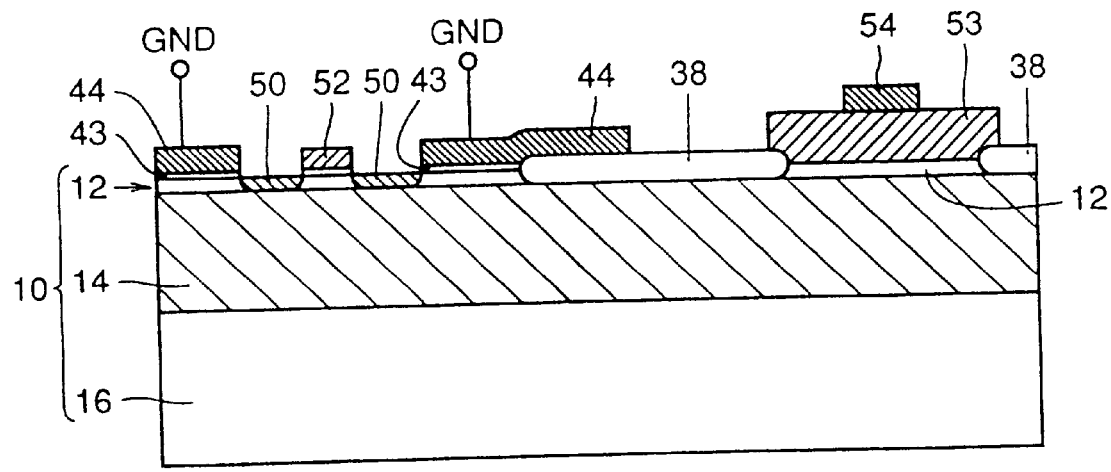

FIG. 21 is a cross sectional view showing a part of the structure of a semiconductor device in accordance with a twenty-first embodiment of the present invention. Referring to FIG. 21, oxide film 38 for LOCOS isolation is not formed under fuse link 54 in contrast to the embodiment shown in FIG. 20. Therefore, oxide film 53 is formed on silicon active layer 12, and fuse link 54 is formed thereon.

According to the twenty-first embodiment, oxide film 38 for LOCOS isolation will not be damaged by laser beam emission for blowing out fuse link 54. Although oxide film 38 for LOCOS isolation is not formed under fuse link 54, silicon substrate 16 will not be damaged by laser beam emission because buried oxide layer 14 is formed.

Embodiment 22

Figure 22:
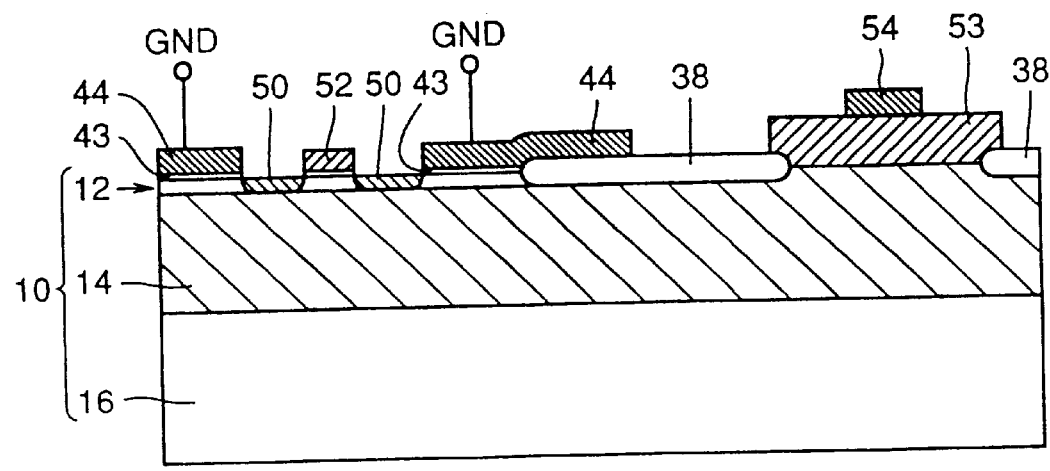

FIG. 22 is a cross sectional view showing a part of the structure of a semiconductor device in accordance with a twenty-second embodiment of the present invention. Referring to FIG. 22, silicon active layer 12 located under fuse link 54 is also removed in the twenty-second embodiment in contrast to the embodiment shown in FIG. 21. Therefore, according to the twenty-second embodiment, the effects similar to those in the twenty-first embodiment shown in FIG. 21 can be obtained and silicon oxide layer 12 will not be damaged by laser beam emission.

Embodiment 23

Figure 23:
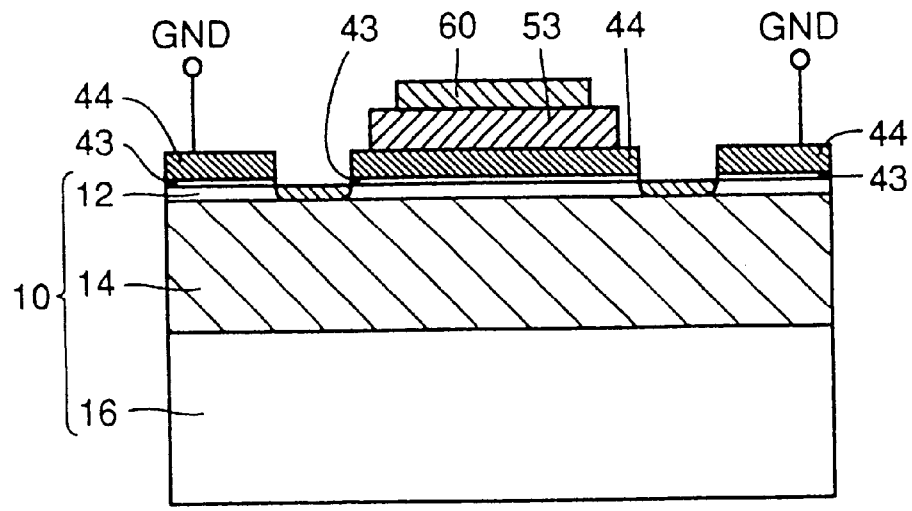
FIGS. 23–27 are cross sectional views showing structures of bonding pad portions of semiconductor devices in accordance with twenty-third to twenty-seventh embodiments of the present invention.

FIG. 23 is a cross sectional view showing a part of the structure of a semiconductor device in accordance with a twenty-third embodiment of the present invention. Referring to FIG. 23, the twenty-third embodiment employs field shield isolation as element isolation. FIG. 23 shows only the field shield isolation region, and the element active regions are formed on both sides of the field shield isolation region shown in the figure. On field shield gate 44 shown in the central part of the figure, oxide film 53 is formed, on which a bonding pad 60 is formed. Bonding pad 60 is formed by, for example, etching an aluminum layer.

Ground voltage GND is applied to each of the field shield gates 44 located on both sides in the figure, whereby silicon active layer 12 under field shield gate 44 attains an off-state. Although ground voltage GND can also be applied to the central field shield gate 44, no voltage is applied thereto here. As a result, this field shield gate 44 is electrically in a floating state. The element active regions (not shown) on both sides thereof are sufficiently isolated because ground voltage GND is applied to the field shield gates 44 on both sides, though the central field shield gate 44 is in a floating state.

According to the twenty-third embodiment, silicon substrate 16 will not be damaged by physical impact of bonding because field shield gate 44 and buried oxide layer 14 are formed under bonding pad 60. Even if bonding pad 60 makes a short circuit with field shield gate 44 thereunder due to the impact of bonding, the voltage of bonding pad 60 will not fluctuate since field shield gate 44 is in a floating state.

Embodiment 24

Figure 24:
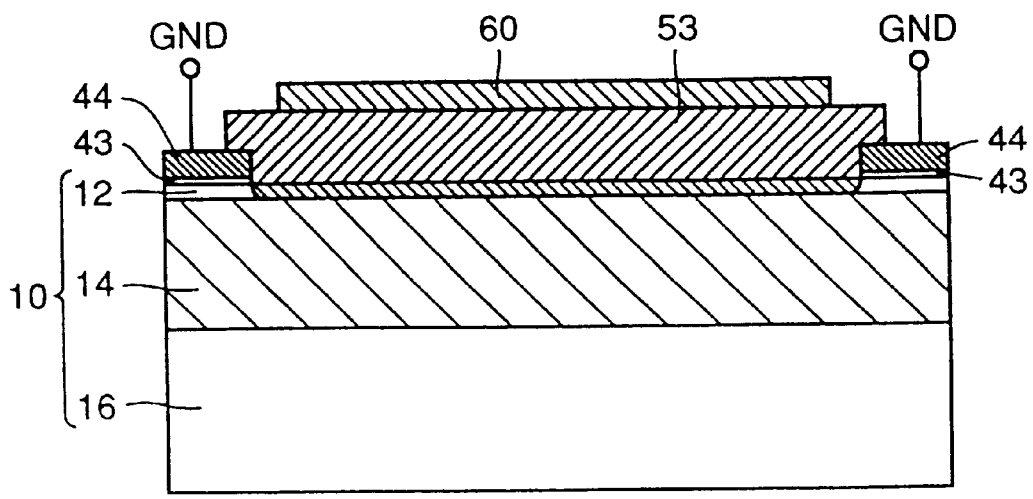

FIG. 24 is a cross sectional view showing a part of the structure of the semiconductor device in accordance with a twenty-fourth embodiment of the present invention. Referring to FIG. 24, field shield gate 44 positioned under bonding pad 60 is removed by etching in the twenty-fourth embodiment. More specifically, oxide film 53 is formed on silicon active layer 12, and bonding pad 60 is formed on oxide film 53.

According to the twenty-fourth embodiment, since the field shield gate under bonding pad 60 is removed, field shield gate 44 will not be damaged by the impact of bonding. Although the field shield gate is not formed under bonding pad 60, silicon substrate 16 will not be damaged by the impact of bonding because buried oxide layer 14 is formed.

Embodiment 25

Figure 25:
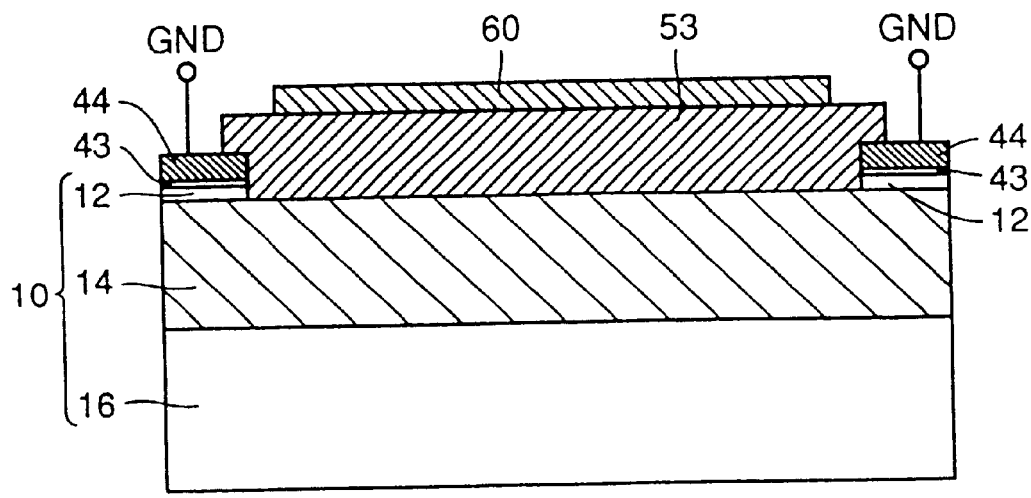

FIG. 25 is a cross sectional view showing a part of the structure of a semiconductor device in accordance with a twenty-fifth embodiment of the present invention. Referring to FIG. 25, the silicon active layer positioned under bonding pad 60 is also etched away in the twenty-fifth embodiment in contrast to the embodiment shown in FIG. 24. Consequently, oxide film 53 is formed on buried oxide layer 14, and bonding pad 60 is formed thereon.

According to the twenty-fifth embodiment, the effects similar to those in the twenty-fourth embodiment can be obtained, and silicon active layer 12 will not be damaged by the impact of bonding because silicon active layer 12 under bonding pad 60 is removed.

Embodiment 26

Figure 26:
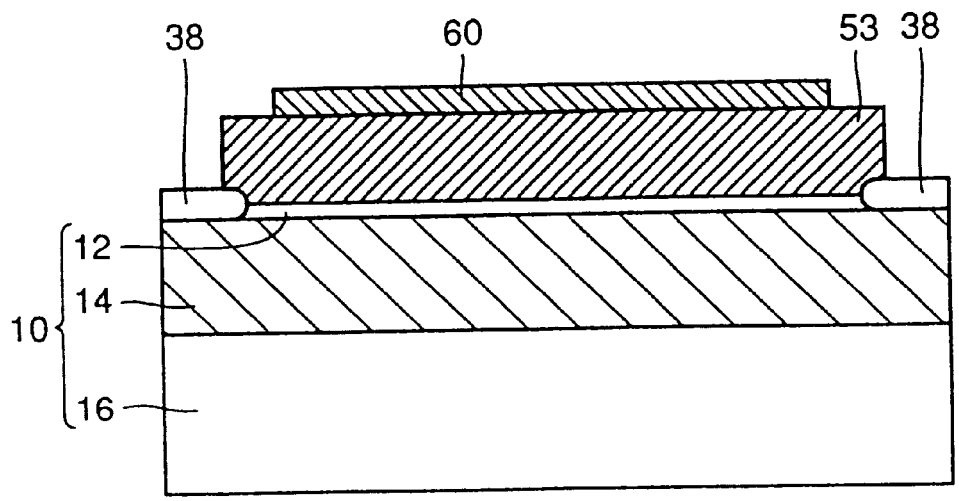

FIG. 26 is a cross sectional view showing a part of the structure of a semiconductor device in accordance with a twenty-sixth embodiment of the present invention. Referring to FIG. 26, the twenty-sixth embodiment employs LOCOS isolation instead of field shield isolation of FIG. 24. More specifically, oxide film 38 for LOCOS isolation is formed on buried oxide layer 14.

According to the twenty-sixth embodiment, the similar effects to those in the twenty-fourth embodiment shown in FIG. 24 can be obtained, though LOCOS isolation is employed in place of field shield isolation.

Embodiment 27

Figure 27:
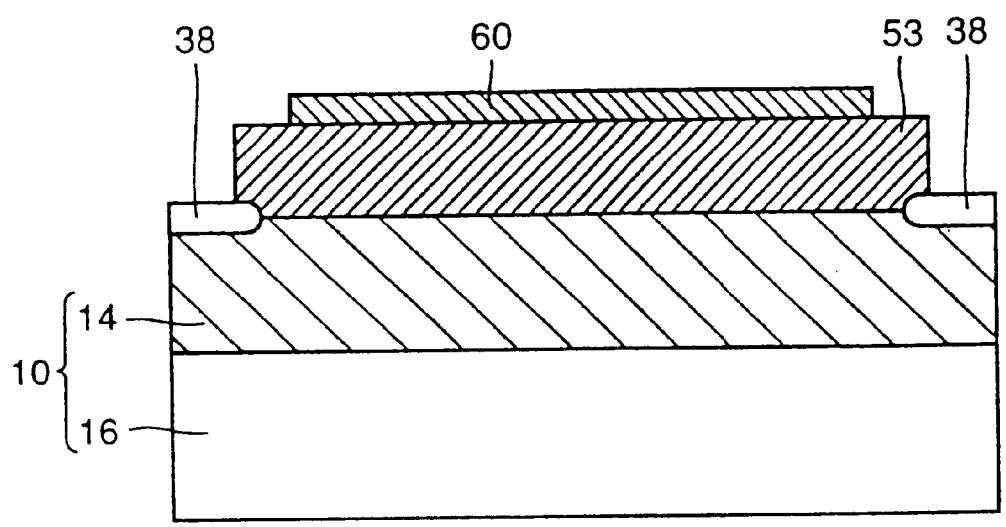

FIG. 27 is a cross sectional view showing a part of the structure of a semiconductor device in accordance with a twenty-seventh embodiment of the present invention. Referring to FIG. 27, silicon active layer 12 shown in FIG. 26 is removed by, for example, etching in the twenty-seventh embodiment. Therefore, according to the twenty-seventh embodiment, silicon active layer 12 is not formed under bonding pad 60, so that silicon active layer 12 will not be damaged by the impact of bonding. More specifically, although LOCOS isolation is employed here instead of field shield isolation in FIG. 25, the effects similar to those in the twenty-fifth embodiment shown in FIG. 25 can be obtained.

Embodiment 28

Figure 28:
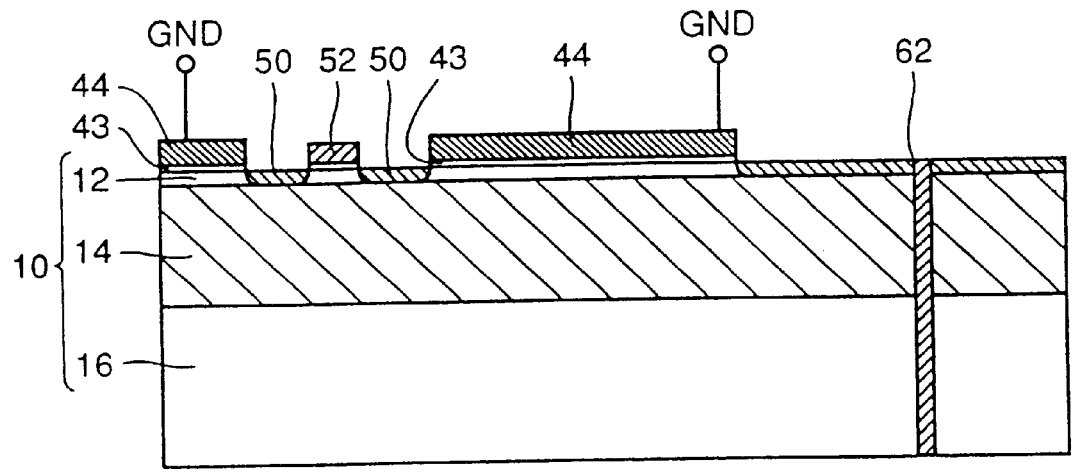
FIGS. 28–36 are cross sectional views showing structures of dicing portions of semiconductor devices in accordance with twenty-eighth through thirty-sixth embodiments of the present invention.

FIG. 28 is a cross sectional view showing a part of the structure of a semiconductor device in accordance with a twenty-eighth embodiment of the present invention. Referring to FIG. 28, a field shield isolation region is formed on SOI substrate 10 for element isolation in this embodiment. SOI substrate 10 is cut along a dicing line 62 having an approximately 50 $\mu$m width and divided into a plurality of chips. The field shield gate 44 located in the proximity of dicing line 62 is removed by etching, here. Therefore, according to the twenty-eighth embodiment, no crack will be generated in field shield gate 44 by the impact of dicing.

Embodiment 29

Figure 29:
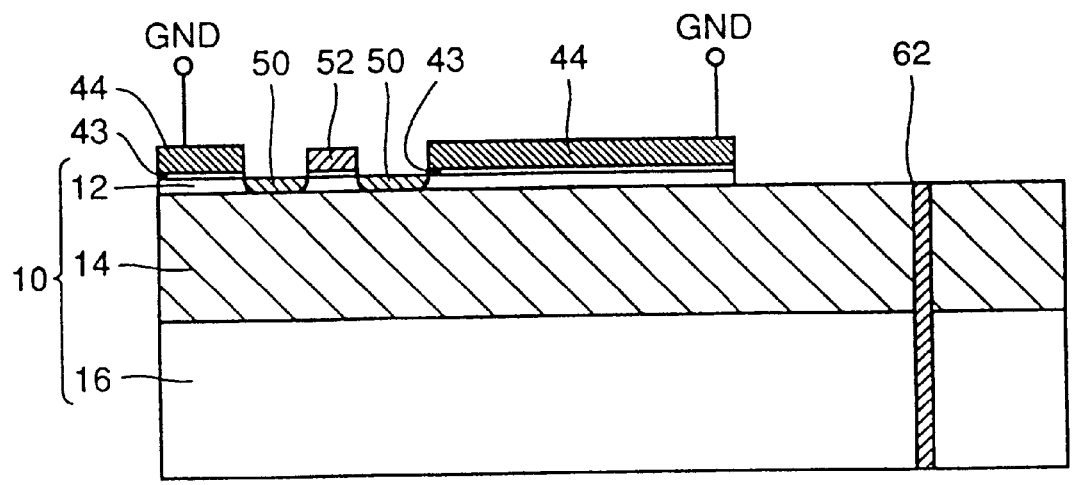

FIG. 29 is a cross sectional view showing a part of the structure of a semiconductor device in accordance with a twenty-ninth embodiment of the present invention. Referring to FIG. 29, silicon active layer 12 in the proximity of dicing line 62 shown in FIG. 28 is also removed by etching in this embodiment. Therefore, according to the twenty-ninth embodiment, the effects of twenty-eighth embodiment shown in FIG. 28 can be obtained and no crack will be generated in silicon active layer 12 by the impact of dicing.

Embodiment 30

Figure 30:
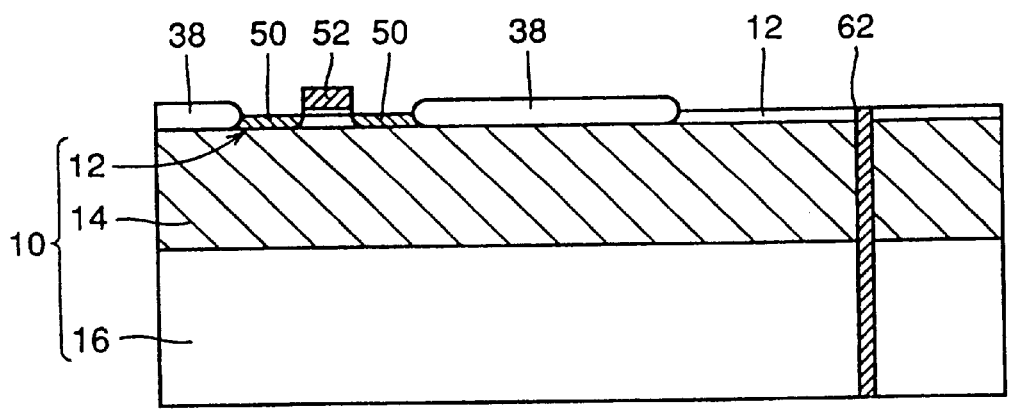

FIG. 30 is a cross sectional view showing a part of the structure of a semiconductor device in accordance with a thirtieth embodiment of the present invention. Referring to FIG. 30, LOCOS isolation is employed in the thirtieth embodiment in place of field shield isolation in FIG. 28. In other words, oxide film 38 for LOCOS isolation is formed on buried oxide film 14. However, oxide film 38 for LOCOS isolation is not formed in the proximity of dicing line 62. Therefore, according to this embodiment, the effects similar to those in the twenty-eighth embodiment shown in FIG. 28 can be obtained, though LOCOS isolation is employed rather than field shield isolation in FIG. 28.

Embodiment 31

Figure 31:
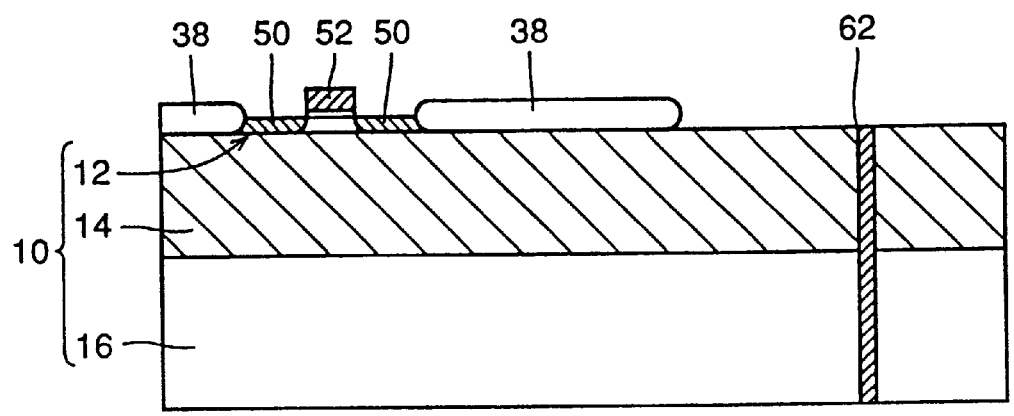

FIG. 31 is a cross sectional view showing a part of the structure of a semiconductor device in accordance with a thirty-first embodiment of the present invention. Referring to FIG. 31, silicon active layer 12 near dicing line 62 shown in FIG. 30 is removed by, for example, etching in this thirty-first embodiment. Therefore, no crack will be generated in silicon active layer 12 by the impact of dicing. In other words, according to this embodiment, although LOCOS isolation is employed in place of field shield isolation, the effects similar to those in the twenty-ninth embodiment shown in FIG. 29 can be obtained.

Embodiment 32

Figure 32:
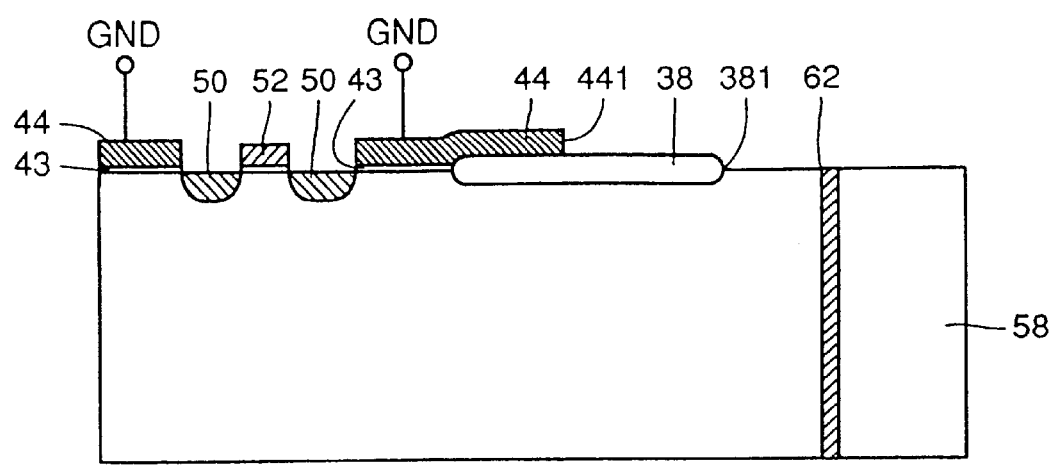

FIG. 32 is a cross sectional view showing a part of the structure of a semiconductor device in accordance with a thirty-second embodiment of the present invention. Referring to FIG. 32, both field shield isolation region and LOCOS isolation region are formed on bulk silicon substrate 58 in this embodiment. Here, a part of field shield gate 44 is formed on oxide film 38 for LOCOS isolation. Neither oxide film 38 for LOCOS isolation nor field shield gate 44 is formed near dicing line 62. An edge 441 of field shield gate 44 is located farther from dicing line 62 than an edge 381 of oxide film 38 for LOCOS isolation.

According to the present embodiment, since neither oxide film 38 for LOCOS isolation nor field shield gate 44 is formed near dicing line 62, no crack will be generated in oxide film 38 or field shield gate 44 by the impact of dicing. Since edge 441 of gate 44 is more distant from dicing line 62 than edge 381 of oxide film 38, damage caused by the impact of dicing to field shield gate 44 is reduced more greatly.

Embodiment 33

Figure 33:
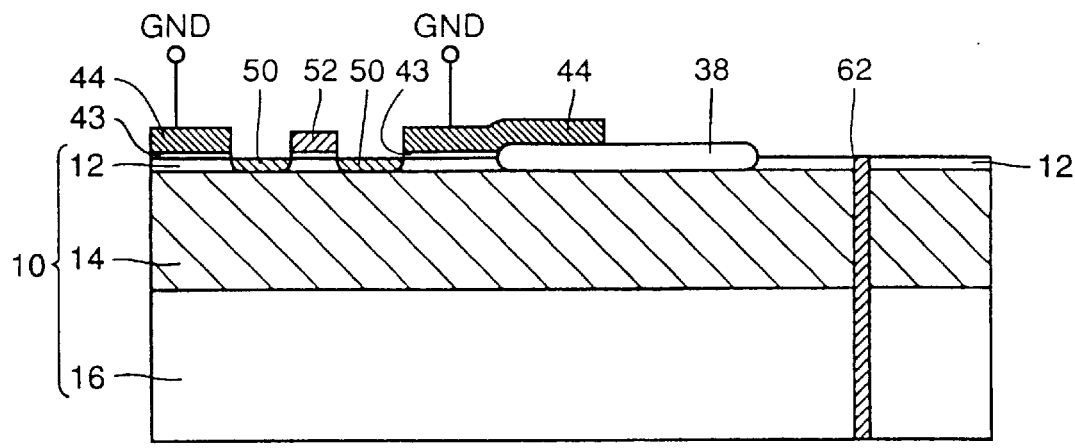

FIG. 33 is a cross sectional view showing a part of the structure of a semiconductor device in accordance with a thirty-third embodiment of the present invention. Referring to FIG. 33, SOI substrate 10 replaces bulk silicon substrate 58 shown in FIG. 32 in the present embodiment.

According to the thirty-third embodiment, neither oxide film 38 for LOCOS isolation nor field shield gate 44 is formed near dicing line 62 similarly to the thirty-second embodiment shown in FIG. 32, thereby suppressing generation of a crack caused by the impact of dicing in oxide film 38 and field shield gate 44.

Embodiment 34

Figure 34:
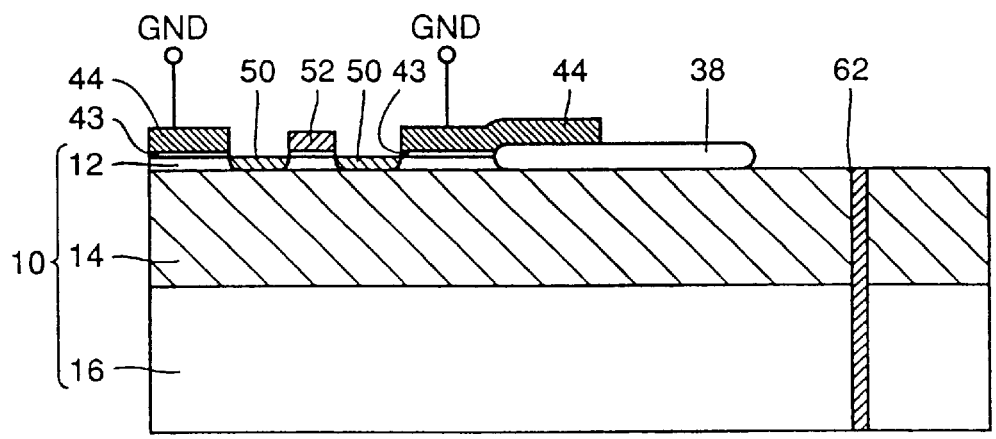

FIG. 34 is a cross sectional view showing a part of the structure of a semiconductor device in accordance with a thirty-fourth embodiment of the present invention. Referring to FIG. 34, silicon active layer 12 near dicing line 62 shown in FIG. 33 is removed by, for example, etching in the thirty-fourth embodiment. Therefore, according to the present embodiment, the effects of Embodiment 33 shown in FIG. 33 can be obtained and no crack will be generated in silicon active layer 12 by the impact of dicing.

Embodiment 35

Figure 35:
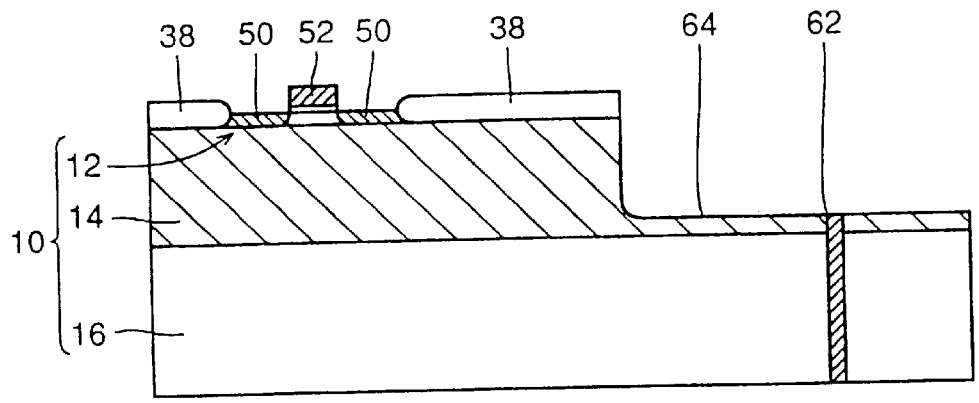

FIG. 35 is a cross sectional view showing a part of the structure of a semiconductor device in accordance with a thirty-fifth embodiment of the present invention. Referring to FIG. 35, in addition to silicon active layer 12, buried oxide layer 14 thereunder is removed by, for example, etching in this embodiment in contrast to the embodiment shown in FIG. 31, and a trench 64 for dicing is formed.

Consequently, according to the present embodiment, the effects of Embodiment 31 shown in FIG. 31 can be obtained and no crack will be generated in buried oxide layer 14 by the impact of dicing because the deep trench 64 reaching buried oxide layer 14 is formed. Furthermore, since the thickness at the portion of dicing line 62 is smaller than that in FIG. 31, the dicing step can be facilitated.

Embodiment 36

Figure 36:
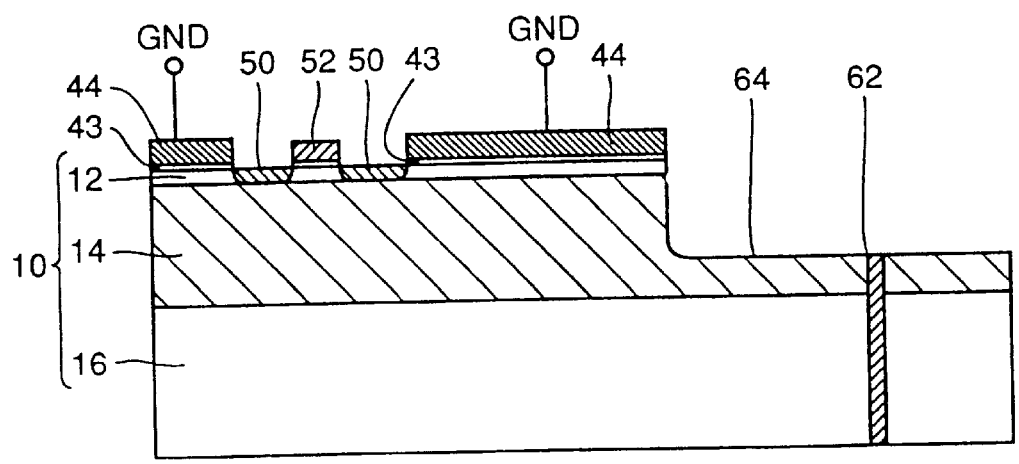

FIG. 36 is a cross sectional view showing a part of the structure of a semiconductor device in accordance with a thirty-sixth embodiment of the present invention. Referring to FIG. 36, the present embodiment employs field shield isolation rather than LOCOS isolation shown in FIG. 35. According to the thirty-sixth embodiment, the effects similar to Embodiment 35 shown in FIG. 35 can be obtained, though field shield isolation is employed in place of LOCOS isolation.

Embodiment 37

Figure 37:
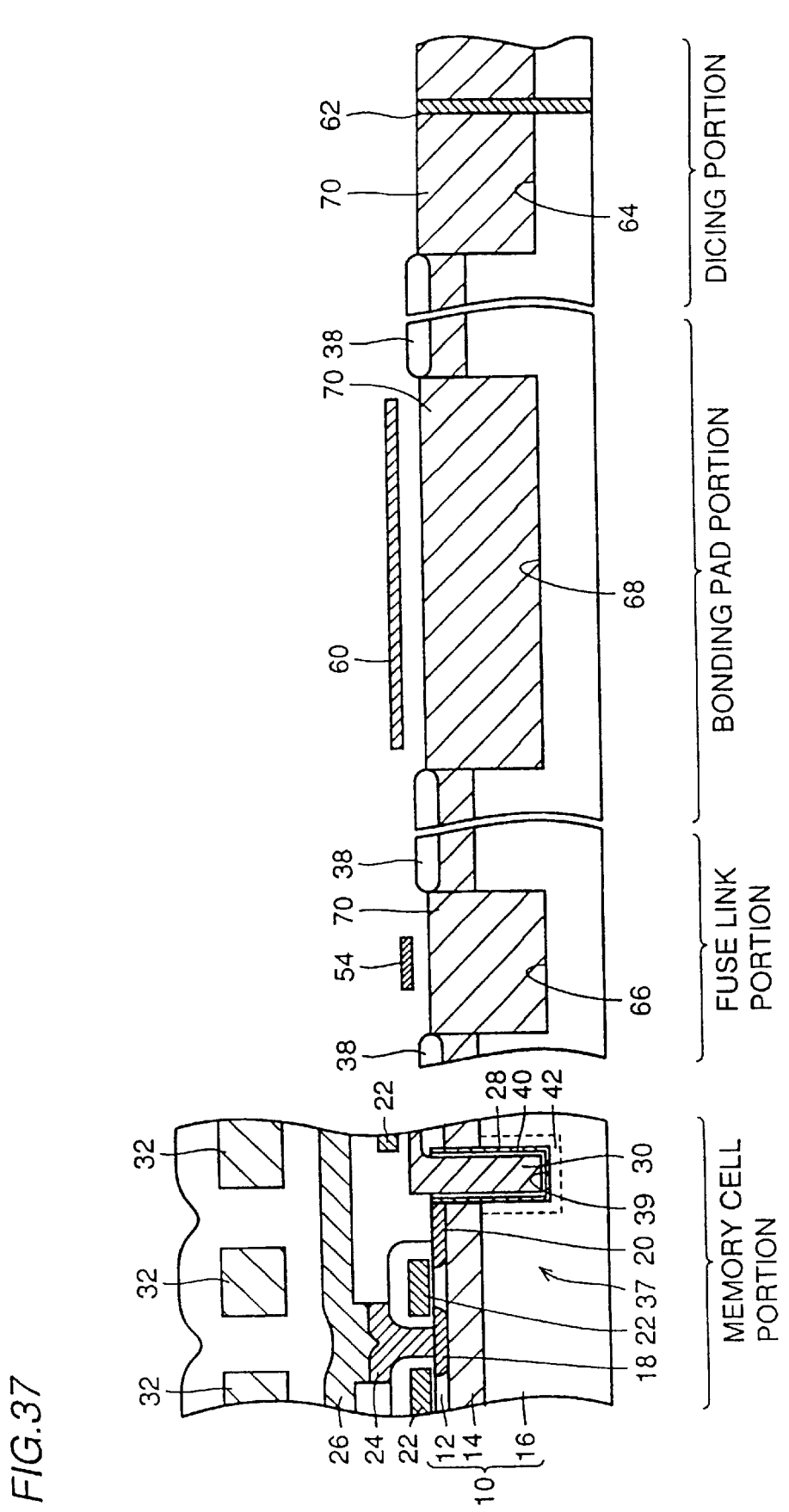
FIG. 37 is a cross sectional view showing structures of a memory cell portion, a fuse link portion, a bonding pad portion, and a dicing portion of a semiconductor device in accordance with a thirty-seventh embodiment of the present invention.

FIG. 37 is a cross sectional view showing the structures of a memory cell portion, a fuse link portion, a bonding pad portion, and a dicing portion in a DRAM in accordance with a thirty-seventh embodiment of the present invention. The memory cell portion shown in FIG. 37 is similar to that shown in FIG. 3. At the fuse link portion, buried oxide layer 14 and silicon substrate 16 positioned under fuse link 54 are etched to form a trench 66. An oxide film 70 is formed in trench 66. At the bonding portion, buried oxide layer 14 and silicon substrate 16 provided under bonding pad 60 are etched to form a trench 68 in which oxide film 70 is formed. At the dicing portion, buried oxide layer 14 and silicon substrate 16 provided near dicing line 62 are etched to form a trench 64, in which oxide film 70 is formed.

Figure 38A:
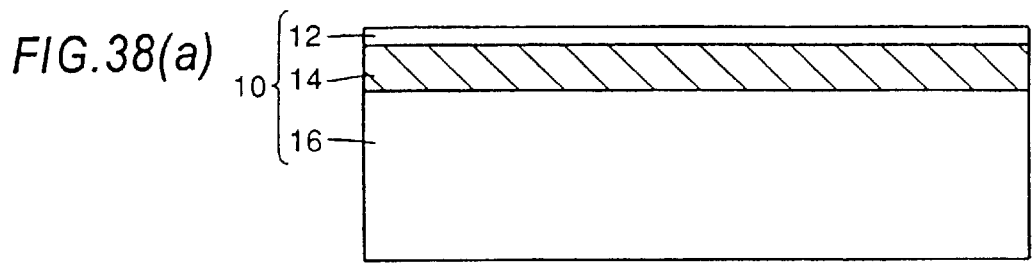
FIG. 38 is a cross sectional view showing the steps of forming the memory cell portion shown in FIG. 37.
Figure 38B:
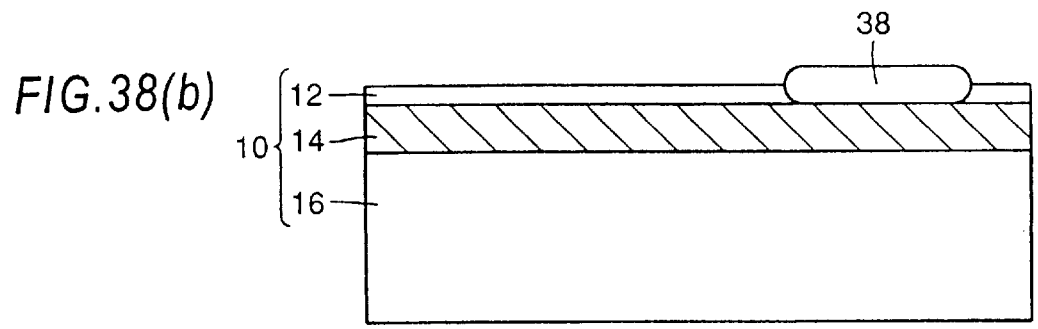
Figure 38C:
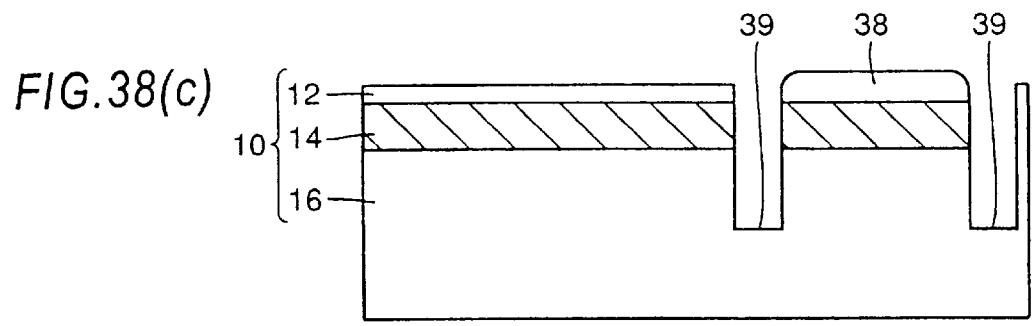

FIG. 38(a)–(d) is a cross sectional view showing the steps of forming the memory cell portion shown in FIG. 37. First, an SOI substrate as shown in FIG. 38(a) is prepared. Next, oxide film 38 for LOCOS isolation is formed by locally oxidizing silicon active layer 12 as shown in FIG. 38(b). Referring to FIG. 38(c), trench 39 penetrating through silicon active layer 12 and buried oxide layer 14 and reaching silicon substrate 16 is formed by etching at a prescribed position of SOI substrate 10.

Figure 38D:
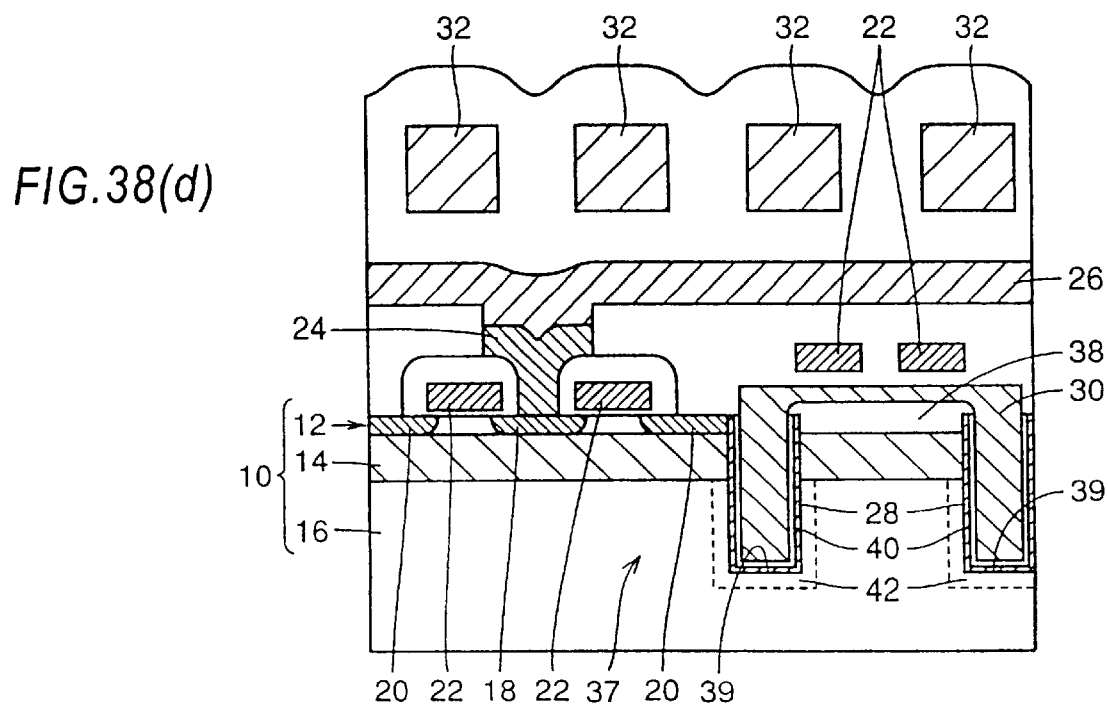

Next, referring to FIG. 38(d), $n^{30}$ type diffusion layer 42 is formed by doping donor at the surface of trench 39 thus formed. Thereafter, storage node 28 of, for example, polysilicon is formed on trench 39. After forming dielectric film 40 on storage node 28, cell plate 30 is formed on dielectric film 40.

A thin oxide film is formed on silicon active layer 12, and then word line 22 of, for example, polysilicon is formed. By doping donor to SOI substrate 10 where word line 22 and the like are formed, source/drain regions 18 and 20 are formed. The interlayer insulation film is formed, and the contact hole is formed by etching the portion of the interlayer insulation film located on source/drain region 18. Intermediate layer 24 is formed in the contact hole, and bit line 26 is formed in contact with intermediate layer 24. On bit line 26, the interlayer insulation film is formed, followed by the formation of aluminum interconnection 32.

Figure 39A:
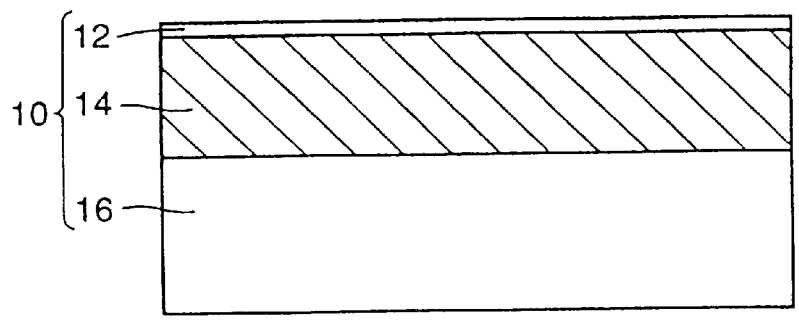
FIG. 39 is a cross sectional view showing the steps of forming the fuse link portion shown in FIG. 37.
Figure 39B:
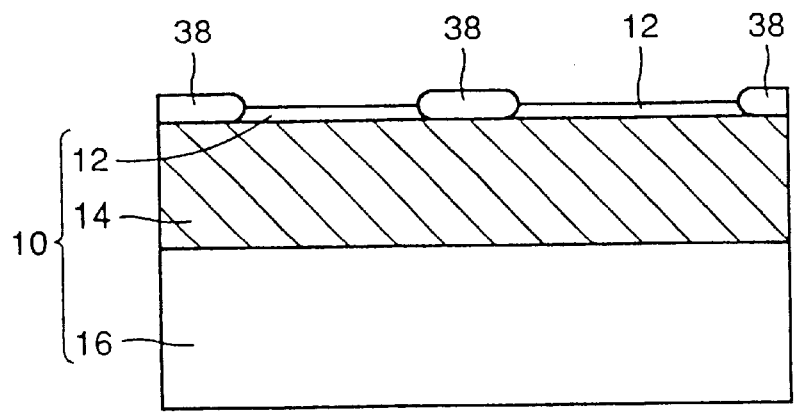
Figure 39C:
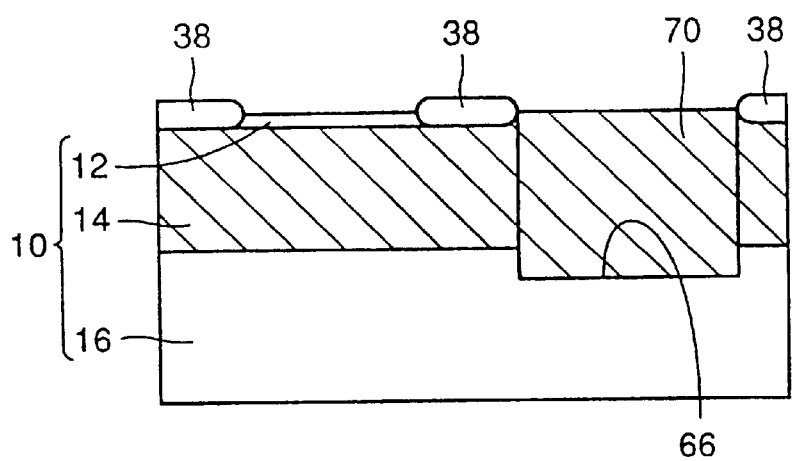

FIG. 39(a)–(d) is a cross sectional view showing the steps of forming the fuse link portion. Simultaneously with FIG. 38(b), oxide film 38 for LOCOS isolation is formed by locally oxidizing silicon active layer 12 as shown in FIG. 39(b). Next, simultaneously with FIG. 38(c), trench 66 is formed by etching a prescribed region between oxide films 38, and oxide film 70 is formed in trench 66 thus formed.

Figure 39D:
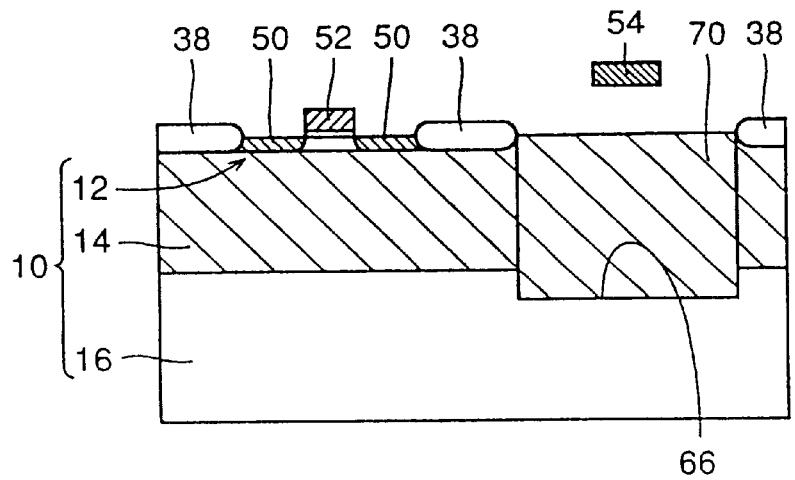

Referring to FIG. 39(d), gate electrode 52 and source/drain region 50 are formed, and fuse link 54 is formed on oxide film 70 at the same time as formation of bit line 26 shown in FIG. 38(d).

Figure 40A:
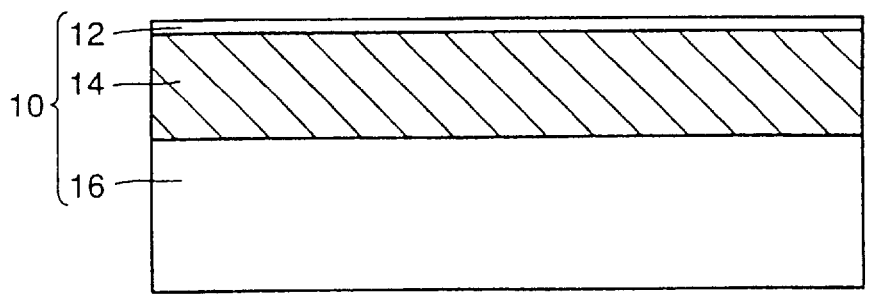
FIG. 40 is a cross sectional view showing the steps of forming the bonding pad portion shown in FIG. 37.
Figure 40B:
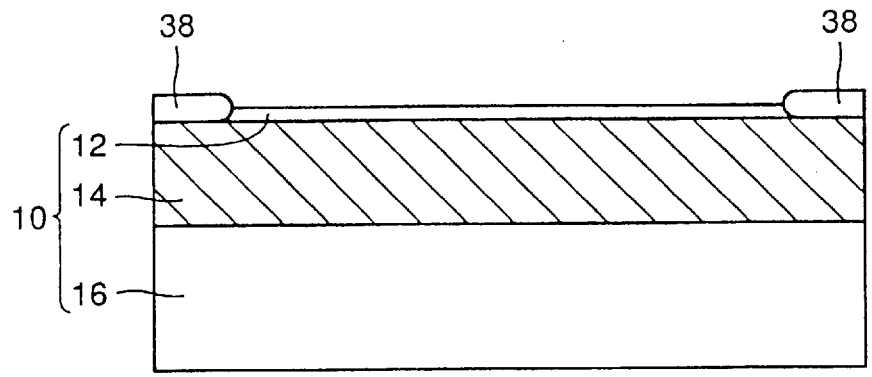
Figure 40C:
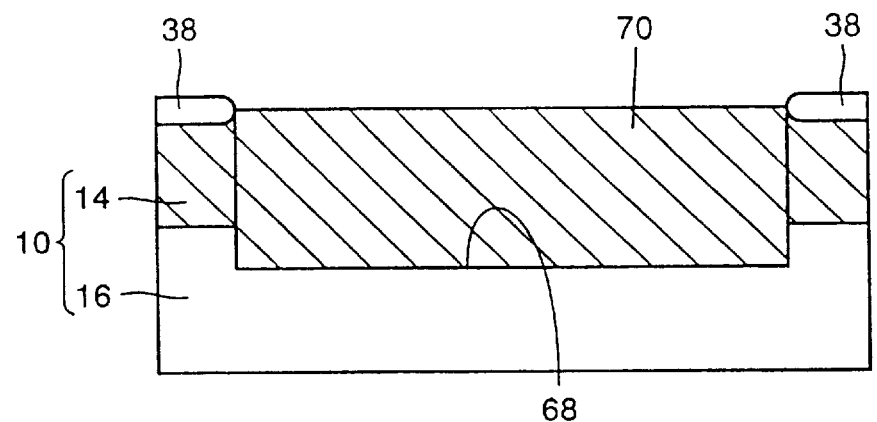

FIG. 40(a)–(d) is a cross sectional view showing the steps of forming the bonding portion shown in FIG. 37. At the same time as FIG. 38(b) and FIG. 39(b), oxide film 38 for LOCOS isolation is formed by locally oxidizing silicon active layer 12 as shown in FIG. 40(b). Next, simultaneously with FIG. 38(c) and FIG. 39(c), trench 68 reaching silicon substrate 16 is formed between oxide films 38 as shown in FIG. 40(c). At the same time as forming oxide film 70 in FIG. 39(c), oxide film 70 is formed in trench 68 thus formed, as shown in FIG. 40(c).

Figure 40D:
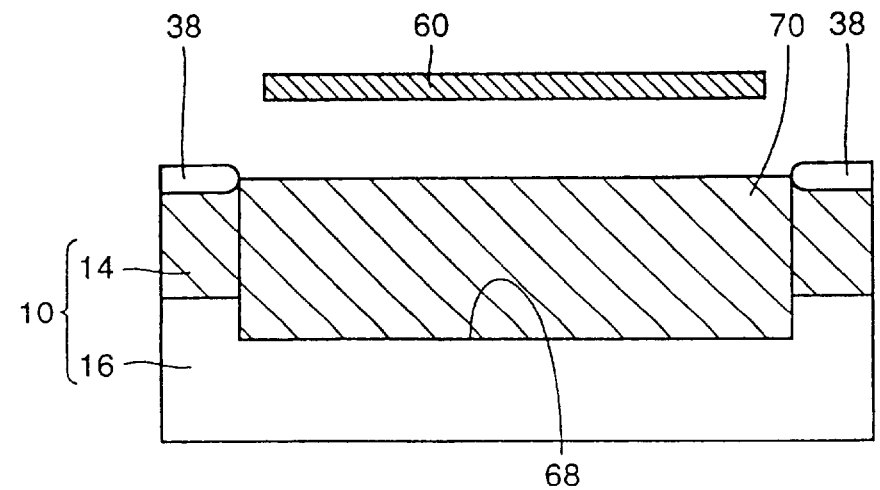

Thereafter, at the same time as forming bit line 26 in FIG. 38 and fuse link 54 in FIG. 39, bonding pad 60 is formed on trench 68 as shown in FIG. 40(d).

FIG. 41 is a cross sectional view showing the steps of forming the dicing portion shown in FIG. 37. Simultaneously with FIG. 38(b), FIG. 39(b), and FIG. 40(b), oxide film 38 for LOCOS isolation is formed by locally oxidizing silicon active layer 12 as shown in FIG. 41(b). Thereafter, simultaneously with FIG. 38(c), FIG. 39(c), and FIG. 40(c), trench 64 reaching silicon substrate 16 is formed near dicing line 62 as shown in FIG. 41(c). At the same time as formation of oxide films 70 shown in FIGS. 39 and 40, oxide film 70 is formed in trench 64 thus formed.

Figure 41A:
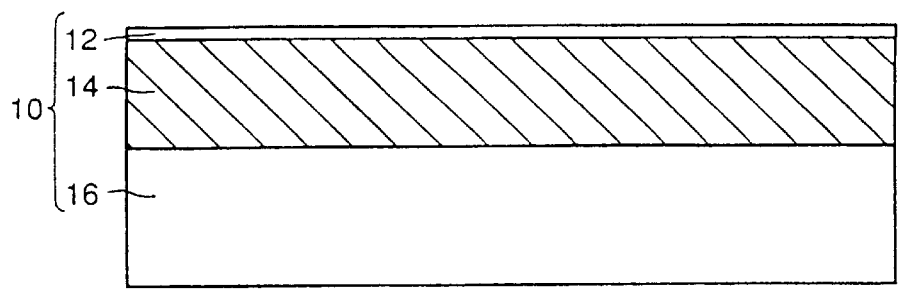
FIG. 41 is a cross sectional view showing the steps of forming the dicing portion shown in FIG. 37.
Figure 41B:
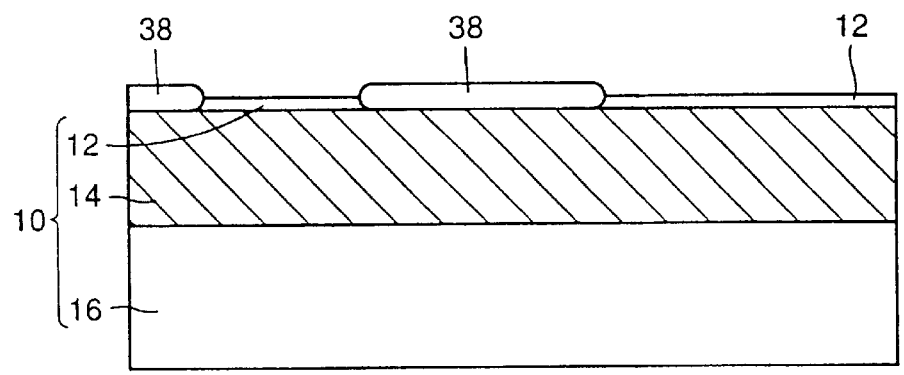
Figure 41C:
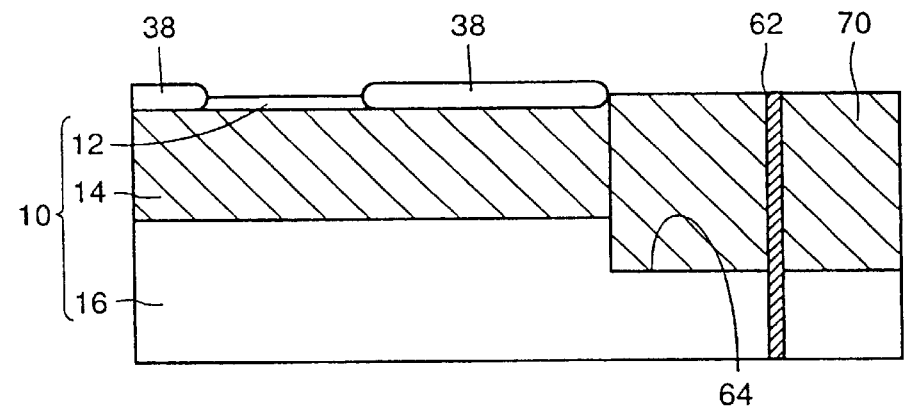
Figure 41D:
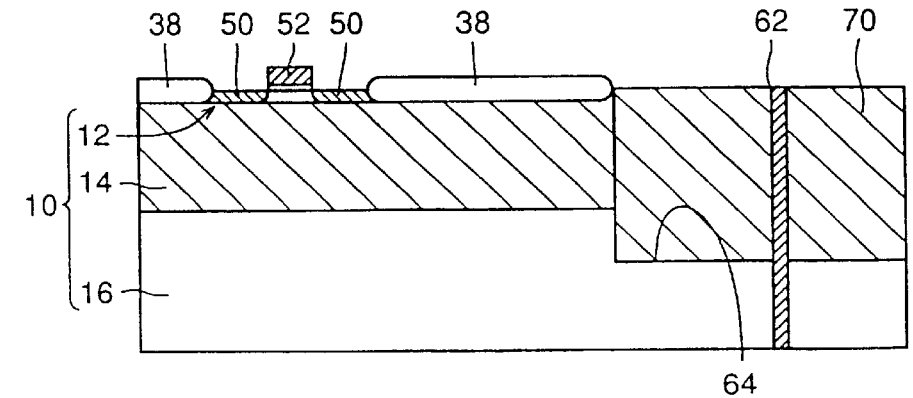

Next, at the same time as forming word line 22 shown in FIG. 38 and gate electrode 52 shown in FIG. 39, gate electrode 52 is formed as shown in FIG. 41(d). Subsequently, at the same time as forming source/drain regions 18 and 20 shown in FIG. 38 and source/drain region 50 shown in FIG. 39, source/drain region 50 is formed as shown in FIG. 41(d).

According to the thirty-seventh embodiment, trench 39 for the capacitor of trench memory cell 37 is formed simultaneously with the formation of trench 66 under fuse link 54, trench 68 under bonding pad 60, and trench 64 near dicing line 62, so that manufacturing steps are simplified as compared to the case where these trenches 39, 64, 66, 68 are formed at different times.

Embodiment 38

Figure 42:
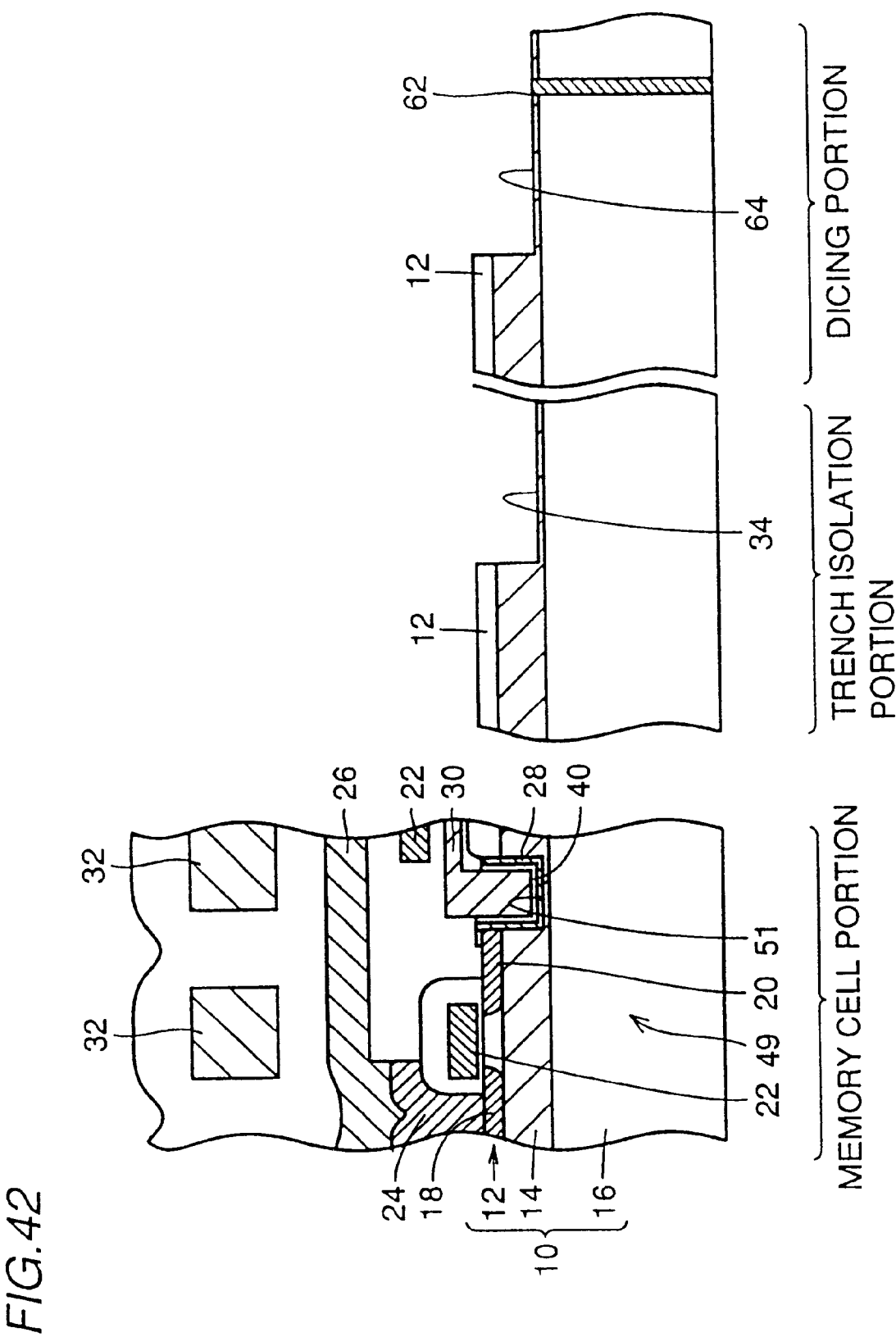
FIG. 42 is a cross sectional view showing structures of a memory cell portion, a trench isolation portion, and a dicing portion of a semiconductor device in accordance with a thirty-eighth embodiment of the present invention.

FIG. 42 is a cross sectional view showing the structures of a memory cell portion, a trench isolation portion and a dicing portion in a DRAM in accordance with a thirty-eighth embodiment of the present invention. The memory cell portion shown in FIG. 42 is structured similarly to that shown in FIG. 9. The trench isolation portion shown in FIG. 42 is structured similarly to the trench isolation portion shown in FIG. 2. The dicing portion shown in FIG. 42 is structured similarly to that shown in FIG. 35.

Here, simultaneously with formation of trench 51 for the capacitor of shallow trench memory cell 49, trench 34 in the trench isolation portion and trench 64 in the dicing portion are formed. Therefore, manufacturing steps are simplified as compared to the case where these trenches are formed at different times.

Although the embodiments of the present invention have been described in detail above, the scope of the present invention is not limited by the above-described embodiments. For example, materials for semiconductor and insulator are not particularly limited. Furthermore, in order to prevent the silicon active layer provided under the gate electrode of the transistor from attaining a floating state electrically, a constant voltage may preferably be applied to the body of such transistor. Various improvements, modifications and variations will become apparent to those skilled in the art once the above disclosure is fully appreciated. It is intended that the following claims be interpreted to embrace all such improvements, modifications and variations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an SOI substrate including a semiconductor substrate, a buried insulation layer formed on said semiconductor substrate, and a semiconductor active layer formed on said buried insulation layer;
    a plurality of elements formed at said semiconductor active layer;
    a first field shield isolation region including a first field shield insulation film formed on said semiconductor active layer between one and another one of said plurality of elements, and a first field shield conductive film formed on said first field shield insulation film and receiving a constant voltage;
    a second field shield isolation region including a second field shield insulation film formed on said semiconductor active layer between said one and another one of said plurality of elements, and a second field shield conductive film formed on said second field shield insulation film and receiving a constant voltage;
    an interlayer insulation film formed between said first and second field shield isolation regions; and
    a fuse link formed on said interlayer insulation film.

2. The semiconductor device according to claim 1, wherein said fuse link is blowable by laser emission.

3. A semiconductor device, comprising:
    an SOI substrate including a semiconductor substrate, a buried insulation layer formed on said semiconductor substrate, and a semiconductor active layer formed on said buried insulation layer;
    a plurality of elements formed at said semiconductor active layer;
    a first element isolation region formed on said buried insulation layer between one and another one of said plurality of elements;
    a second element isolation region formed on said buried insulation layer between said one and another one of said plurality of elements;

an interlayer insulation film formed between said first and second element isolation regions; and a fuse link formed on said interlayer insulation film.

4. The semiconductor device according to claim 3, wherein said fuse link is blowable by laser emission.

5. The semiconductor device according to claim 3, wherein each of said first and second element isolation regions includes an insulator attaining from a surface of said semiconductor active layer to said buried insulation layer.

6. The semiconductor device according to claim 5, wherein said insulator is a LOCOS film.

7. A semiconductor device, comprising:

an SOI substrate including a semiconductor substrate, a buried insulation layer formed on said semiconductor substrate, and a semiconductor active layer formed on said buried insulation layer;

a fuse link formed by said semiconductor active layer, and an LOCOS isolation region adjacent to said fuse link and formed on said buried insulation layer to isolate said fuse link from other elements.

8. The semiconductor device according to claim 7, further comprising a transistor having source and drain regions formed in said semiconductor active layer.

9. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

an LOCOS isolation region formed between one and another one of said plurality of elements;

a fuse link formed on said LOCOS isolation region; and a field shield isolation region including a field shield insulation film formed on said semiconductor active layer, and a field shield conductive film formed on said field shield insulation film and receiving a constant voltage, wherein said fuse link is formed in the same layer as said field shield conductive film.

10. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

an element isolation region formed on said buried insulation layer between one and another one of said plurality of elements;

a field shield isolation region including a field shield insulation film formed on said semiconductor active layer, and a field shield conductive film formed on said field shield insulation film; and a fuse link formed on said SOI substrate in the same layer as said field shield conductive film.

11. The semiconductor device according to claim 10, wherein said field shield isolation region is formed between said element isolation region and said one element.

12. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

a first field shield isolation region including a first field shield insulation film formed on said semiconductor active layer between one and another one of said plurality of elements, and a first field shield conductive film formed on said first field shield insulation film and receiving a constant voltage;

a second field shield isolation region including a second field shield insulation film formed on said semiconductor active layer between said one and another one of said plurality of elements, and a second field shield conductive film formed on said second field shield insulation film and receiving a constant voltage;

an interlayer insulation film formed between said first and second field shield isolation regions; and a fuse link formed on said interlayer insulation film; wherein said semiconductor active layer is formed in a region except a region under said fuse link.

13. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

a first element isolation region formed on said buried insulation layer between one and another one of said plurality of elements;

a second element isolation region formed on said buried insulation layer between said one and another one of said plurality of elements;

an interlayer insulation film formed between said first and second element isolation regions; and a fuse link formed on said interlayer insulation film; wherein said semiconductor active layer is formed in a region except a region under said fuse link.

14. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

an LOCOS isolation region formed between one and another one of said plurality of elements;

a fuse link formed on said LOCOS isolation region; and a field shield isolation region including a field shield insulation film formed on said semiconductor active layer, and a field shield conductive film formed on said field shield insulation film and receiving a constant voltage, wherein said field shield isolation region is formed between said LOCOS isolation region and said one element.

15. A semiconductor device, comprising:

an SOI substrate including a semiconductor substrate, a buried insulation layer formed on said semiconductor substrate, and a semiconductor active layer formed on said buried insulation layer;

a plurality of elements formed at said semiconductor active layer;

an LOCOS isolation region formed between one and another one of said plurality of elements;

a fuse link formed on said LOCOS isolation region; and a field shield isolation region including a field shield insulation film formed on said semiconductor active layer, and a field shield conductive film formed on said field shield insulation film and receiving a constant voltage, wherein:

said field shield isolation region is formed between said LOCOS isolation region and said one element; and said field shield conductive film extends onto said LOCOS isolation region.

* * * * *

UNITED STATES PATENT AND TRADEMARK OFFICE
CERTIFICATE OF CORRECTION

PATENT NO. : 5,982,005
DATED : November 09, 1999
INVENTOR(S) : Hideto HIDAKA, et al.

It is certified that error appears in the above-identified patent and that said Letter Patent is hereby corrected as shown below:

Column 4, line 8, change "Fig. 38 is a cross sectional view" to --Figs. 38(a)-38(d) are cross sectional views--.

Line 10, change "Fig. 39 is a cross sectional view" to --Figs. 39(a)-39(d) are cross sectional views--.

Line 12, change "Fig. 40 is a cross sectional view" to --Figs. 40(a)-40(d) are cross sectional views--.

Line 14, change "Fig. 41 is a cross sectional view" to --Figs. 41(a)-41(d) are cross sectional views--.

Signed and Sealed this

Tenth Day of April, 2001

*Attest:*

NICHOLAS P. GODICI

*Attesting Officer*     *Acting Director of the United States Patent and Trademark Office*